(12) United States Patent
Kim et al.

(10) Patent No.: US 9,544,520 B2
(45) Date of Patent: Jan. 10, 2017

(54) ANALOG SIGNAL GENERATION CIRCUIT

(71) Applicant: SAMSUNG ELECTRONICS CO., LTD., Suwon-si (KR)

(72) Inventors: Sunjung Kim, Yongin-si (KR); Taechan Kim, Yongin-si (KR); Seunghoon Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/694,409

(22) Filed: Apr. 23, 2015

(65) Prior Publication Data

US 2015/0311887 A1  Oct. 29, 2015

Related U.S. Application Data

(60) Provisional application No. 61/985,061, filed on Apr. 28, 2014.

(30) Foreign Application Priority Data

Jun. 23, 2014 (KR) .................. 10-2014-0076506

(51) Int. Cl.
| | |
|---|---|
| *H03B 1/00* | (2006.01) |
| *H03K 3/00* | (2006.01) |
| *H04N 5/378* | (2011.01) |
| *H03M 1/56* | (2006.01) |
| *H03M 1/12* | (2006.01) |

(52) U.S. Cl.
CPC ............ *H04N 5/378* (2013.01); *H03M 1/1295* (2013.01); *H03M 1/56* (2013.01)

(58) Field of Classification Search
CPC ............................. H03K 3/356; G09G 3/3696
USPC ............... 327/108–112, 427, 434, 437, 126; 348/222.1, 231.6, 251, 239; 345/212; 326/82, 83, 86, 87; 250/208.1
See application file for complete search history.

(56) References Cited

U.S. PATENT DOCUMENTS

| | | |
|---|---|---|
| 7,193,198 B2 | 3/2007 | Dai |
| 7,321,329 B2 | 1/2008 | Tooyama et al. |
| 7,379,011 B2 | 5/2008 | Ham et al. |
| 7,489,354 B2 | 2/2009 | Lee et al. |
| 7,880,662 B2 | 2/2011 | Bogaerts |

(Continued)

FOREIGN PATENT DOCUMENTS

| | | |
|---|---|---|
| KR | 10-0390839 B1 | 7/2003 |
| KR | 10-0399970 B1 | 9/2003 |

(Continued)

*Primary Examiner* — Lincoln Donovan
*Assistant Examiner* — Thomas Skibinski
(74) *Attorney, Agent, or Firm* — Sughrue Mion, PLLC

(57) ABSTRACT

An analog signal generation circuit is provided. The analog signal generation circuit includes a first control section that generates a first control signal; a second control section that generates a second control signal; current cells, each of the plurality of current cells controlled to generate current or to not generate current based on the first and second control signals; and an analog signal output section that outputs an analog signal generated based on current generated by the current cells. The first control signal includes first and second cell state setting signals. A logical value corresponding to the first cell state setting signal is complementary to a logical value corresponding to the second cell state setting signal. Each current cell has an initialized state based on the first cell state setting signal.

20 Claims, 22 Drawing Sheets

(56) References Cited

U.S. PATENT DOCUMENTS

| | | |
|---|---|---|
| 8,279,311 B2 | 10/2012 | Lim |
| 8,441,387 B2 | 5/2013 | Wang |
| 8,587,681 B2 | 11/2013 | Guidash |
| 2005/0083422 A1 | 4/2005 | Lee et al. |
| 2006/0071147 A1 | 4/2006 | Dai |
| 2007/0008206 A1 | 1/2007 | Tooyama et al. |
| 2007/0046513 A1 | 3/2007 | Ham et al. |
| 2009/0256735 A1 | 10/2009 | Bogaerts |
| 2010/0128137 A1 | 5/2010 | Guidash |
| 2010/0208112 A1 | 8/2010 | Lim |
| 2011/0122274 A1* | 5/2011 | Itzhak .................. H04N 5/378 348/222.1 |
| 2011/0226935 A1* | 9/2011 | Kawahito ........ H01L 27/14603 250/208.1 |
| 2012/0194367 A1 | 8/2012 | Wang |
| 2013/0162587 A1 | 6/2013 | Chan et al. |
| 2013/0201361 A1* | 8/2013 | Yang ................. H04N 5/23229 348/222.1 |
| 2013/0258157 A1 | 10/2013 | Nam et al. |
| 2013/0284890 A1 | 10/2013 | Moholt |
| 2014/0009650 A1 | 1/2014 | Kim et al. |
| 2014/0014815 A1 | 1/2014 | Lee et al. |
| 2014/0042300 A1 | 2/2014 | Hsu |
| 2014/0104263 A1* | 4/2014 | Kim .................... G09G 3/3696 345/212 |
| 2015/0264273 A1* | 9/2015 | Feder ................ H04N 5/35554 348/239 |

FOREIGN PATENT DOCUMENTS

| | | |
|---|---|---|
| KR | 10-0588751 B1 | 6/2006 |
| KR | 10-0744117 B1 | 8/2007 |
| KR | 10-2010-0092544 A | 8/2010 |
| KR | 10-2013-0110409 A | 10/2013 |
| KR | 10-2014-0006465 A | 1/2014 |
| KR | 10-2014-0010718 A | 1/2014 |

* cited by examiner

ANALOG SIGNAL GENERATION CIRCUIT

CROSS-REFERENCE TO RELATED APPLICATIONS

The present application claims priority from U.S. Provisional Application No. 61/985,061 filed on Apr. 28, 2014, and Korean Patent Application No. 10-2014-0076506 filed on Jun. 23, 2014, the disclosures of which are incorporated herein in their entirety by reference.

BACKGROUND

1. Field

Apparatuses and methods consistent with exemplary embodiments relate to a control of a circuit, and more particularly, to a circuit and a method capable of generating an analog signal.

2. Description of the Related Art

Recently, various kinds of electronic devices are being used. An electronic circuit included in an electronic device is controlled by an electric signal and performs its own function. A variety of circuit control methods are utilized to obtain a result of performing the function of the electronic circuit.

For instance, an image sensor is used to generate image information. Pixels of the image sensor receive light and generate a current having an intensity that varies according to the intensity of the received light. Further, digital signals corresponding to the pixels are generated. Digital values of the generated digital signals vary according to the intensity of generated current. Based on the generated digital signals, image information is generated. Herein, circuit control for converting an analog signal (i.e., current) into a digital signal is performed when the image sensor generates the image information.

In the above example, the intensity of the generated current needs to be determined to decide a digital value corresponding to a digital signal. A reference signal to be compared with the generated current is required to determine the intensity of the generated current. The reference signal is called as a ramp signal. The ramp signal has a value that stepwise increases or decreases within a predetermined interval. An interval which a value corresponding to the intensity of the generated current belongs to is determined by comparing the intensity of the generated current with the intensity of the ramp signal. A digital value corresponding to the generated digital signal is decided based on the interval which the value corresponding to the intensity of the generated current belongs to.

The ramp signal is a reference signal that is to be compared with an analog signal (e.g., a current). The ramp signal is an analog signal, too. That is, when the image sensor generates image information, circuit control is performed to generate the ramp signal which is an analog signal.

SUMMARY

According to an aspect of an exemplary embodiment, there is provided an analog signal generation circuit including a first control section configured to generate a first control signal; a second control section configured to generate a second control signal; a plurality of current cells, each current cell configured to generate current or to not generate current based on the first control signal and the second control signal; and an analog signal output section configured to output an analog signal generated based on current provided from the plurality of current cells. The first control signal includes a first cell state setting signal and a second cell state setting signal. The first control section includes a cell state setting signal generation section configured to generate the first cell state setting signal and the second cell state setting signal in response to an initialization signal. A logical value corresponding to the first cell state setting signal is complementary to a logical value corresponding to the second cell state setting signal. A current cell selected to be controlled by the first control signal and the second control signal from among the plurality of current cells is configured to have an initialized state based on the first cell state setting signal.

The current cell selected to be controlled by the first control signal and the second control signal may be configured to have a transition state different from the initialized state based on the second cell state setting signal.

When the current cell selected to be controlled by the first control signal and the second control signal generates current at the initialized state, the current cell selected to be controlled by the first control signal and the second control signal may not generate current at the transition state.

When the current cell selected to be controlled by the first control signal and the second control signal does not generate current at the initialized state, the current cell selected to be controlled by the first control signal and the second control signal may generate current at the transition state.

All of the plurality of current cells may be controlled to be in the initialized state and after all the plurality of current cells are in the initialized state, each of the plurality of current cells may be successively controlled to have the transition state based on the second cell state setting signal.

An intensity of current provided to the analog signal output section may vary according to the number of current cells controlled to have the transition state from among the plurality of current cells.

The plurality of current cells may be arranged along a first direction and a second direction. The first control section may include a first replica section configured to replicate the first cell state setting signal as many as the number of current cells arranged along the second direction, and provide the replicated first cell state setting signals to the plurality of current cells along the first direction; and a second replica section may be configured to replicate the second cell state setting signal as many as the number of current cells arranged along the second direction, and provide the replicated second cell state setting signals to the plurality of current cells along the first direction.

According to an aspect of another exemplary embodiment, there is provided an analog signal generation circuit including a first control section configured to generate a first control signal; a second control section configured to generate a second control signal; a plurality of current cells, each current cell configured to generate current or to not generate current based on the first control signal and the second control signal; and an analog signal output section configured to output a first reference signal and a second reference signal that are generated based on current provided from the plurality of current cells. The first control signal includes a first cell state setting signal and a second cell state setting signal. The first control section includes a cell state setting signal generation section configured to generate the first cell state setting signal and the second cell state setting signal in response to an initialization signal. A logical value corresponding to the first cell state setting signal is complementary to a logical value corresponding to the second cell state setting signal. A current cell selected to be controlled by the first control signal and the second control signal from among the plurality of current cells is configured to have an initialized state based on the first cell state setting signal. The analog signal output section includes a first output route for providing the first reference signal to a first output terminal; a second output route and a third output route configured to provide the second reference signal to a second output terminal; and a switch section configured to control a connection between the second output terminal, and the second output route and the third output route based on a mode selection signal such that the second reference signal is provided to the second output terminal through one of the second output route and the third output route.

The cell state setting signal generation section may generate the first cell state setting signal and the second cell state setting signal by using the initialization signal and the mode selection signal.

The second control section may include a control signal generation section for generating the second control signal by using an address signal and the initialization signal.

The current cell selected to be controlled by the first control signal and the second control signal may be configured to have a transition state different from the initialized state based on the second cell state setting signal.

Waveforms of the first cell state setting signal and the second cell state setting signal may be changed according to the mode selection signal.

Each of the first reference signal and the second reference signal may be one of a 4T ramp signal and a 3T ramp signal.

The second reference signal may be the 4T ramp signal when the mode selection signal has a logical value corresponding to logic '0', and the second reference signal may be the 3T ramp signal when the mode selection signal has a logical value corresponding to logic '1'.

The second reference signal may be the 3T ramp signal when the mode selection signal has a logical value corresponding to logic '0', and the second reference signal may be the 4T ramp signal when the mode selection signal has a logical value corresponding to logic '1'.

According to an aspect of another exemplary embodiment, there is provided an analog signal generation circuit including a first control section configured to generate a first control signal; a second control section configured to generate a second control signal; a plurality of current cells, each current cell configured to generate current or to not generate current based on the first control signal and the second control signal; and an analog signal output section configured to output a first reference signal and a second reference signal generated based on current provided from the plurality of current cells. The analog signal output section includes a first output route for providing the first reference signal to a first output terminal; a second output route and a third output route configured to provide the second reference signal to a second output terminal; and a switch section configured to control a connection between the second output terminal, and the second output route and the third output route based on a mode selection signal such that the second reference signal is provided to the second output terminal through one of the second output route and the third output route.

The analog signal output section may include a switch signal generation section configured to generate a first switch signal and a second switch signal based on the mode selection signal. The first switch signal may control a connection between the second output route and the second output terminal, and the second switch signal may control a connection between the third output route and the second output terminal.

A logical value corresponding to the first switch signal may be complementary to a logical value corresponding to the second switch signal.

A waveform of the second reference signal output from the second output terminal may be selected based on the mode selection signal.

A waveform of the first reference signal output from the first output terminal may be different from a waveform of the second reference signal output from the second output terminal.

According to aspect of another exemplary embodiment, there is provided an analog signal generation circuit including a first control section configured to generate both a first cell state setting signal and a second cell state setting signal, in response to an initialization signal, the first cell state setting signal being logically complementary to the second cell state setting signal; a second control section configured to generate a second control signal; a plurality of current cells, each current cell configured to output a first reference signal of a first waveform and a second reference signal of a second waveform, the first waveform and the second waveform being selected according to a mode selection signal, wherein the current cells are selected based on the first cell state setting signal, the second cell state setting signal, and the second control signal, and are set to an initialization state based on the first cell state setting signal, and a transition state based on the second cell state setting signal.

BRIEF DESCRIPTION OF THE DRAWINGS

The above and/or other aspects will become apparent from the following detailed description of exemplary embodiments with reference to the following figures, wherein like reference numerals refer to like parts throughout the various figures unless otherwise specified, and wherein.

DETAILED DESCRIPTION

Figure 1:
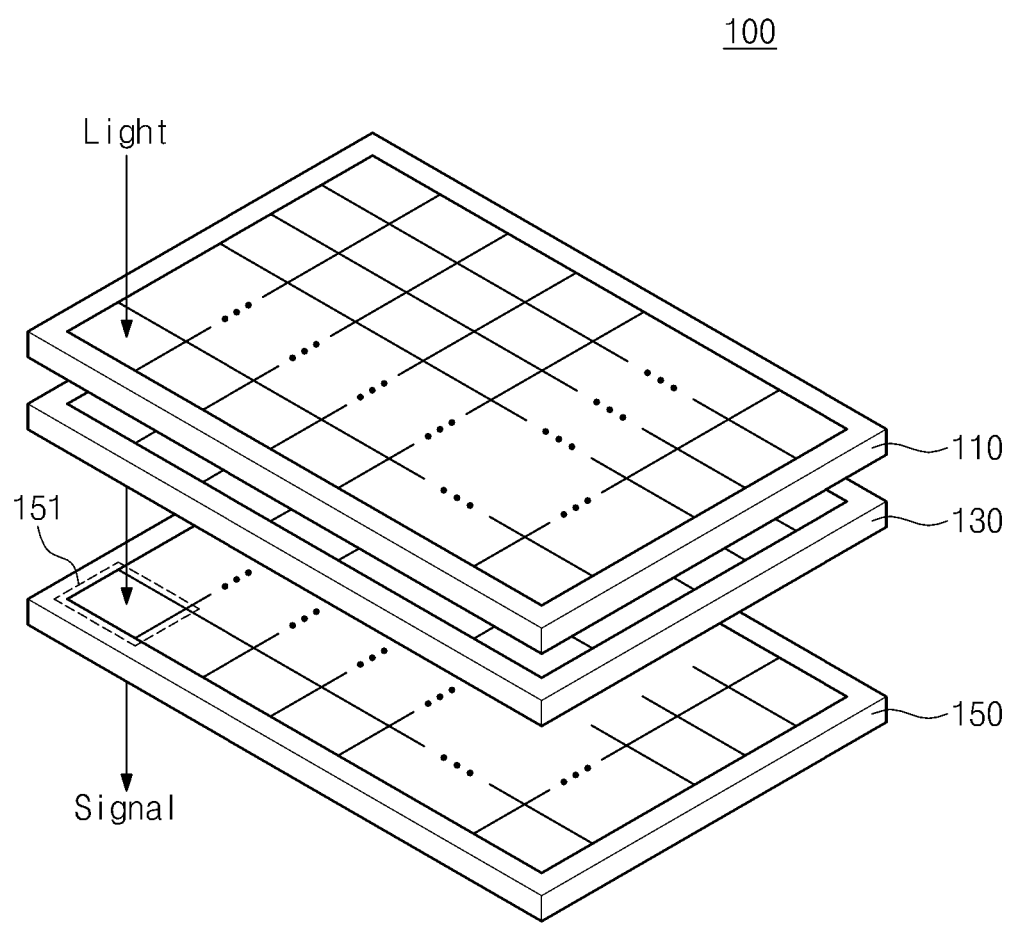
FIG. 1 is a diagram illustrating a pixel array of an image sensor.

Various exemplary embodiments will be described in detail below with reference to the accompanying drawings. The present inventive concept, however, may be embodied in various different forms, and should not be construed as being limited only to the illustrated exemplary embodiments. Rather, these exemplary embodiments are provided as examples so that this disclosure will be thorough and complete, and will fully convey the inventive concept to those skilled in the art. Accordingly, known processes, elements, and techniques are not described with respect to some of the exemplary embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer or section discussed below could be termed a "second" element, component, region, layer or section without departing from the teachings of the present disclosure.

The terminology used herein is for the purpose of describing particular exemplary embodiments only and is not intended to be limiting of the present inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram illustrating a pixel array of an image sensor. A pixel array 100 may be formed of a plurality of pixels. The pixel array 100 may receive light and generate an electric signal at each pixel. The pixel array 100 may include a first filter array 110, a second filter array 130, and a photo-sensitive element array 150. The pixel array 100 may further comprise other components that are not illustrated in FIG. 1. FIG. 1 is an example diagram for helping to understand a configuration of the pixel array 100. The configuration of the pixel array 100 is not limited thereto.

The first filter array 110 and the second filter array 130 may pass light. In particular, the first filter array 110 and the second filter array 130 may include a plurality of visible light pass filters. Each visible light pass filter may pass light having a specific frequency component. For instance, each visible light pass filter may be a red light pass filter, a green light pass filter, or a blue light pass filter. In some exemplary embodiments, at least one of the first filter array 110 and the second filter array 130 may further include other kinds of filter, such as an infrared light pass filter.

As an alternative to the configuration shown in FIG. 1, in some exemplary embodiments a plurality of visible light pass filters may form one layer. However, as illustrated in FIG. 1, a plurality of visible light pass filters may form two layers including the first filter array 110 and the second filter array 130. If a plurality of visible light pass filters forms two layers, the number of visible light pass filters provided on a unit area may increase. In other exemplary embodiments, a plurality of visible light pass filters may form three or more layers. That is, the number of visible light pass filters is not particularly limited.

The photo-sensitive element array 150 may include a plurality of photo-sensitive elements 151. A configuration of the photo-sensitive element 151 will be described with reference to FIGS. 2 and 3. The photo-sensitive element array 150 may receive light that passes through the first filter array 110 and the second filter array 130. The photo-sensitive element array 150 may generate, at each pixel, an electric signal of which the intensity varies according to the intensity of the received light. The generated electric signal is an analog signal having a current value. As will be described later, a digital signal may be generated based on the generated electric signal, and image information may be formed based on the digital signal.

FIG. 1 illustrates that the photo-sensitive element array 150 forms one layer. However, the configuration is not limited thereto. For instance, in some exemplary embodiments, the photo-sensitive element array 150 may form two layers. In this case, the pixel array 100 may be configured to include a photo-sensitive element array corresponding to the first filter array 110 and a photo-sensitive element array corresponding to the second filter array 130. In other exemplary embodiments, the photo-sensitive element array may form three or more layers. That is, the number of photo-sensitive element arrays is not particularly limited.

FIG. 1 illustrates that the pixel array 100 has a configuration for sensing light. However, in other exemplary embodiments, the pixel array 100 may further include other kinds of sensors, such as a gyroscope sensor, an acceleration sensor, a gravity sensor, and so on. Thus, it will be understood that FIG. 1 merely illustrates one of several possible configurations of the pixel array 100.

Figure 2:
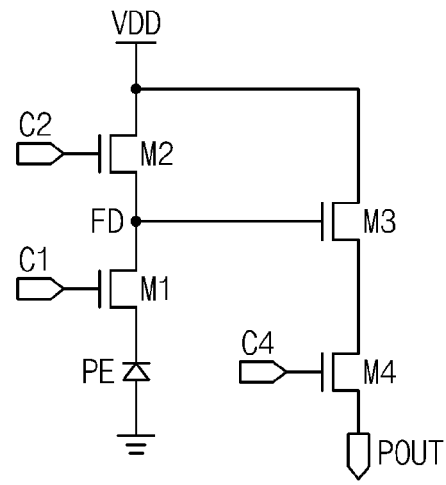
FIG. 2 is a diagram illustrating a photo-sensitive element including four transistors.

FIG. 2 is a diagram illustrating a photo-sensitive element of the image sensor of FIG. 1, according to an exemplary embodiment. A photo-sensitive element 151a includes four transistors M1, M2, M3 and M4. A photo-sensitive element 151 of FIG. 1 may have a configuration illustrated in FIG. 2. A configuration illustrated in FIG. 2 is referred to as a "4T structure".

A photoelectric conversion element PE may receive light that passes through the first filter array 110 and the second filter array 130 (refer to FIG. 1), and generate a charge. The amount of charge generated by the photoelectric conversion element PE may vary according to the intensity of the received light. The photoelectric conversion element PE may be one of, but not limited to, a photo diode, a photo transistor, a photo gate, a pinned photo diode, and so on.

A first transistor M1 may transfer a charge generated by the photoelectric conversion element PE to a floating diffusion node FD in response to a driving signal C1. A second transistor M2 may be connected to a terminal to which a driving voltage VDD is supplied. The second transistor M2 may discharge the charge stored at the floating diffusion node FD in response to a driving signal C2. A third transistor M3 may buffer charge flow in response to the charge stored at the floating diffusion node FD. A fourth transistor M4 may receive the charge from the third transistor M3, and output a pixel signal POUT in response to a driving signal C4.

The pixel signal POUT is an analog signal of which the intensity varies according to the amount of charge provided to the fourth transistor M4 through the third transistor M3. The pixel signal POUT may have two kinds of levels. First, when the charge stored at the floating diffusion node FD is discharged by the second transistor M2 (e.g., when charge is reset), the pixel signal POUT has a first level. Hereinafter, the first level is referred to as a "reset level". Next, when charge is generated by the photoelectric conversion element PE, the pixel signal POUT has a second level. Hereinafter, the second level is referred to as a "signal level".

Figure 3:
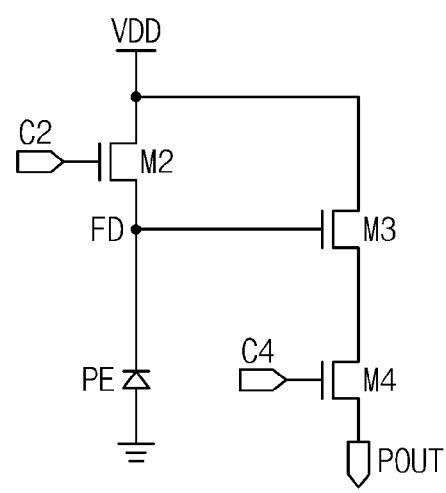
FIG. 3 is a diagram illustrating a photo-sensitive element including three transistors.

FIG. 3 is a diagram illustrating a photo-sensitive element of the image sensor of FIG. 1, according to another exemplary embodiment. A photo-sensitive element 151b includes three transistors M2, M3 and M4. A photo-sensitive element 151 of FIG. 1 may have a configuration illustrated in FIG. 3. A configuration illustrated in FIG. 3 is referred to as a "3T structure".

A configuration of the photo-sensitive element 151b is obtained by removing the first transistor M1 from the photo-sensitive element 151a illustrated in FIG. 2. That is, in the photo-sensitive element 151b, charge generated by a photoelectric conversion element PE may be directly provided to a floating diffusion node FD. Functions and operations of the transistors M2, M3 and M4 included in the photo-sensitive element 151b are substantially the same as those of the transistors M2, M3 and M4 included in the photo-sensitive element 151a illustrated in FIG. 2. Thus, repeated descriptions associated with the transistors M2, M3 and M4 of the photo-sensitive element 151b are omitted for conciseness.

Figure 4:
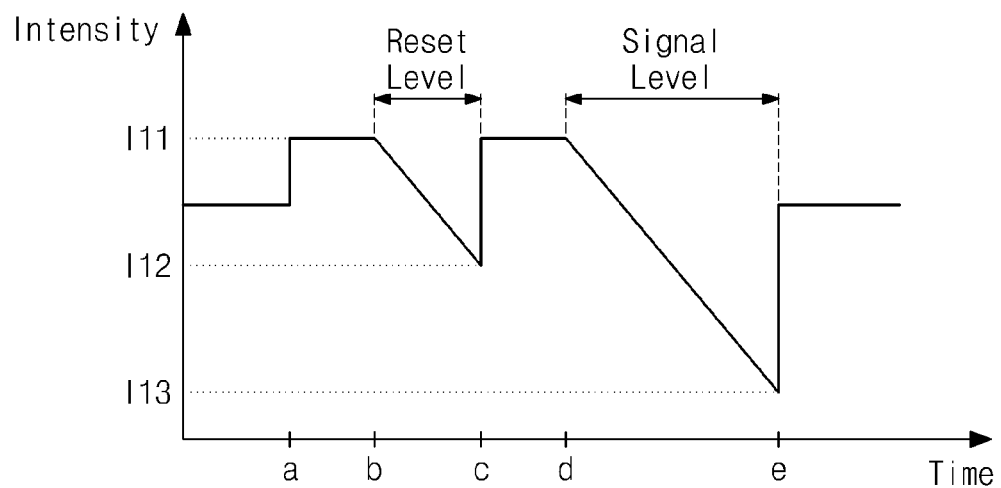
FIG. 4 is a graph illustrating a waveform of a reference signal that is compared with an electric signal generated by a photo-sensitive element including four transistors.

FIG. 4 is a graph illustrating a waveform of a reference signal that is compared with an electric signal generated by a photo-sensitive element including four transistors. A reference signal having a waveform illustrated in FIG. 4 is an analog signal that is compared with a pixel signal POUT (refer to FIG. 2) output from a photo-sensitive element 151a illustrated in FIG. 2. Hereinafter, the reference signal having a waveform illustrated in FIG. 4 is referred to as a "4T ramp signal".

First, the 4T ramp signal is set to have first intensity I11 at "a". Then, the intensity of the 4T ramp signal gradually decreases (more precisely, stepwise decreases, refer to FIG. 16 to be described later) from "b" to "c" within an intensity interval which is defined by the first intensity I11 and second intensity I12. A reset level of the pixel signal POUT output from the photo-sensitive element 151a is determined while the intensity of the 4T ramp signal is decreasing within the intensity interval which is defined by the first intensity I11 and the second intensity I12.

Next, the 4T ramp signal is set to have the first intensity I11 again at "c". The intensity of the 4T ramp signal gradually decreases (more precisely, stepwise decreases) from "d" to "e" within an intensity interval which is defined by the first intensity I11 and third intensity I13. A signal level of the pixel signal POUT output from the photo-sensitive element 151a is determined while the intensity of the 4T ramp signal is decreasing within the intensity interval which is defined by the first intensity I11 and the third intensity I13.

Figure 5:
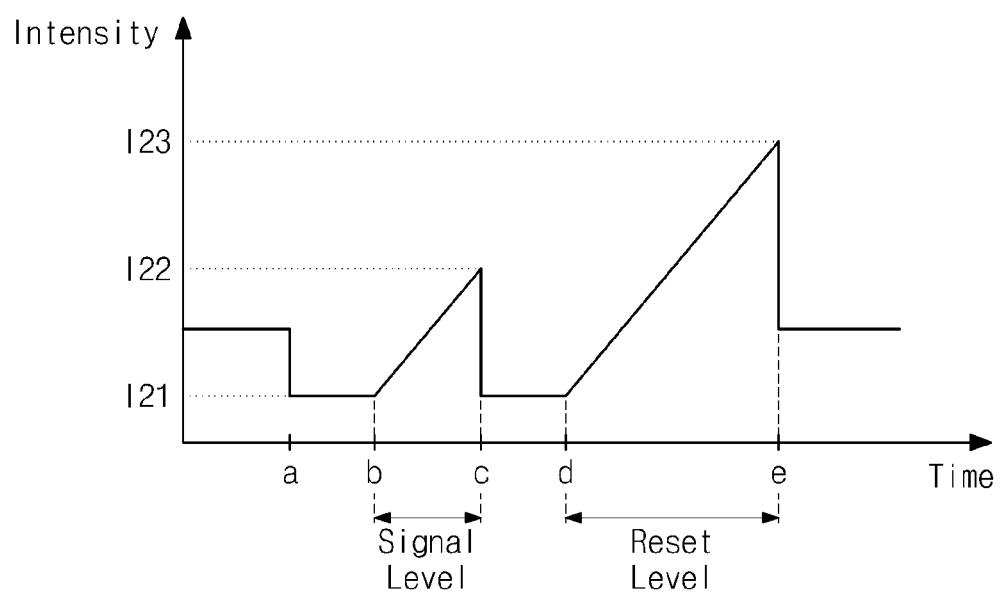
FIG. 5 is a graph illustrating a waveform of a reference signal that is compared with an electric signal generated by a photo-sensitive element including three transistors.

FIG. 5 is a graph illustrating a waveform of a reference signal that is compared with an electric signal generated by a photo-sensitive element including three transistors. A reference signal having a waveform illustrated in FIG. 5 is an analog signal that is compared with a pixel signal POUT (refer to FIG. 3) output from a photo-sensitive element 151b illustrated in FIG. 3. Hereinafter, the reference signal having a waveform illustrated in FIG. 5 is referred to as a "3T ramp signal".

First, the 3T ramp signal is set to have first intensity I21 at "a". Then, the intensity of the 3T ramp signal gradually increases (more precisely, stepwise increases, refer to FIG. 18 to be described later) from "b" to "c" within an intensity interval which is defined by the first intensity I21 and second intensity I22. A signal level of the pixel signal POUT output from the photo-sensitive element 151b is determined while the intensity of the 3T ramp signal is increasing within the intensity interval which is defined by the first intensity I21 and the second intensity I22.

Next, the 3T ramp signal is set to have the first intensity I21 again at "c". The intensity of the 3T ramp signal gradually increases (more precisely, stepwise increases) from "d" to "e" within an intensity interval which is defined by the first intensity I21 and third intensity I23. A reset level of the pixel signal POUT output from the photo-sensitive element 151b is determined while the intensity of the 3T ramp signal is increasing within the intensity interval which is defined by the first intensity I21 and the third intensity I23.

As illustrated in FIGS. 4 and 5, a waveform of the 4T ramp signal is different from that of the 3T ramp signal. The reason is that a 4T structure and a 3T structure are different from each other as illustrated in FIGS. 2 and 3.

Figure 6:
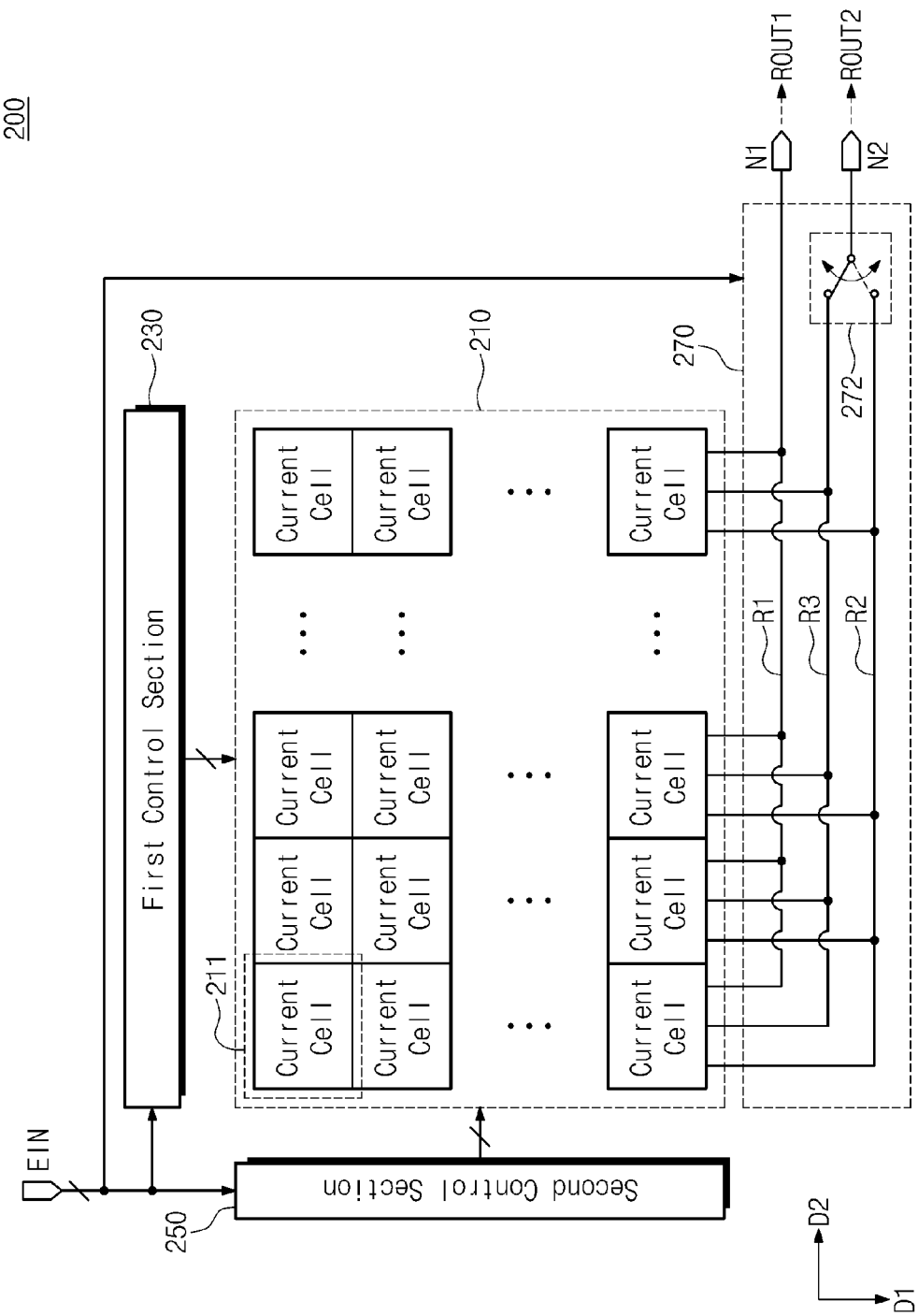
FIG. 6 is a block diagram illustrating an analog signal generation circuit according to an exemplary embodiment.

FIG. 6 is a block diagram illustrating an analog signal generation circuit according to an exemplary embodiment. An analog signal generation circuit 200 may include a current cell array 210, a first control section 230, a second control section 250, and an analog signal output section 270.

The current cell array 210 may include a plurality of current cells 211. As illustrated in FIG. 6, current cells 211 included in the current cell array 210 may be arranged along a first direction D1 and a second direction D2. For the sake of easy understanding, it is assumed that the first direction D1 is a column direction and the second direction D2 is a row direction. Below, it is further assumed that the current cells 211 are arranged along C columns and R rows. However, the first direction D1 and the second direction D2 are not limited to a column direction and/or a row direction, and the current cells are not limited to an arrangement in columns and/or rows. That is, the first direction D1 and the second direction D2 are not particularly limited, and the layout configuration of the current cells is not particularly limited.

Each current cell 211 may generate current or not generate current. Current may flow or not flow through each current cell 211. In particular, current may flow or not flow through each current cell 211 according to a control of the first control section 230 and the second control section 250. The intensity of current generated by the current cell array 210 may vary according to the number of current cells which generate current from among the plurality of the current cells 211. For example, the intensity of the current generated by the current cell array 210 may vary according to the number of current cells which generate current from among all of the current cells 211 in the current cell array 210. An analog signal may be generated based on current flowing through the current cell array 210.

Figure 18:
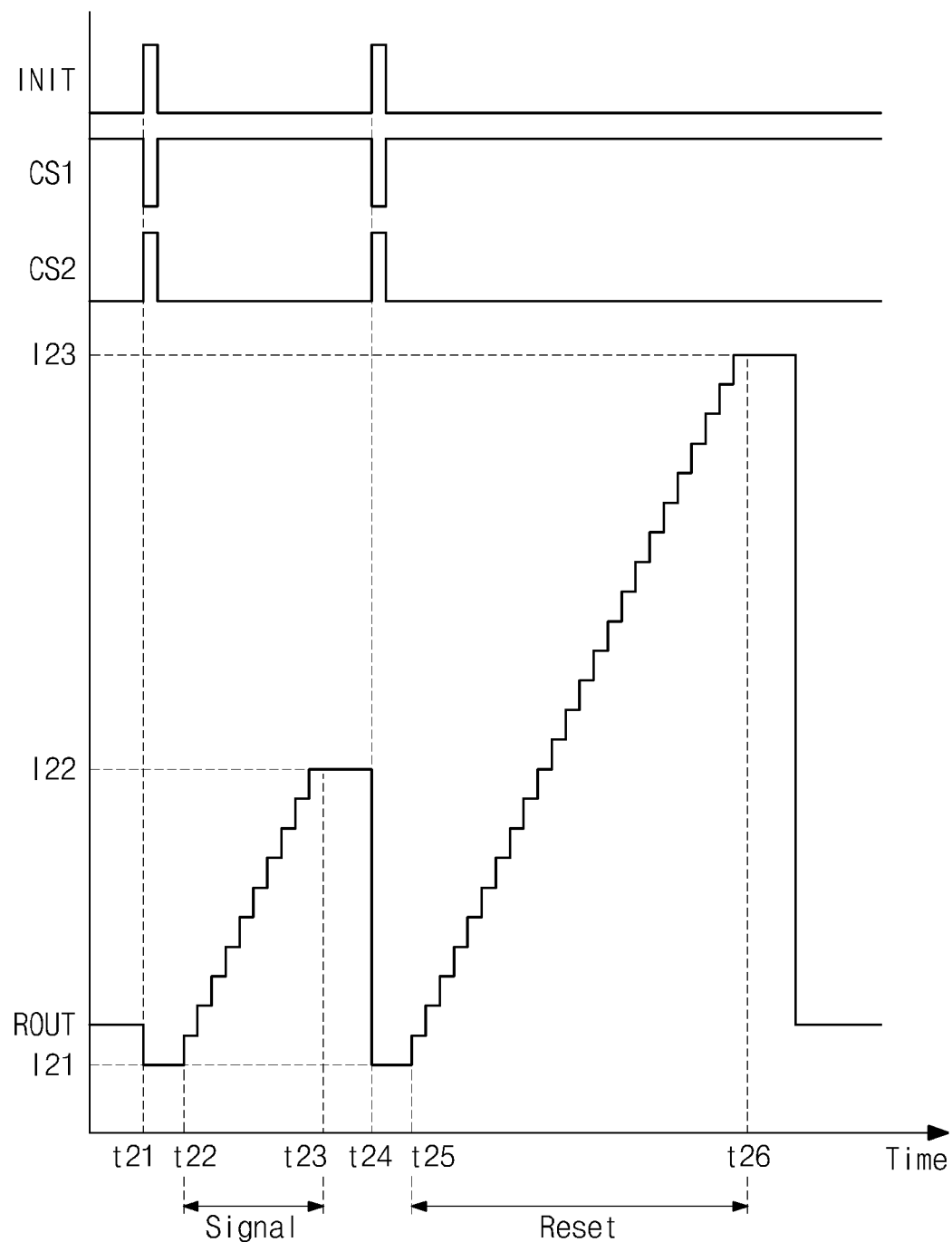

In some exemplary embodiments, the generated analog signal may be at least one of a 4T ramp signal illustrated in FIG. 4 (or FIG. 16) and a 3T ramp signal illustrated in FIG. 5 (or FIG. 18). The intensity of the analog signal may increase or decrease, as illustrated in FIGS. 4 and 5, by adjusting the number of current cells which generate current. Configurations and operations of each current cell 211 will be described in detail with reference to FIGS. 8, 9 and 13.

The first control section 230 and the second control section 250 may control the current cell array 210. The first control section 230 may generate a first control signal. The first control signal may be provided along the first direction D1 (e.g., a column direction). The second control section 250 may generate a second control signal. The second control signal may be provided along the second direction D2 (e.g., a row direction). Each current cell 211 may be selected to be controlled by the first control signal and the second control signal. The selected current cell may be controlled to generate current or not generate current. Current may flow or not flow through the selected current cell.

In some exemplary embodiments, at least one of the first control section 230 and the second control section 250 may receive an external control signal through an external input terminal EIN. For instance, the external control signal may be provided from a register or a control circuit separately configured from the analog signal generation circuit 200. Alternatively, the external control signal may be provided from a user. Signals may be exchanged between the first control section 230 and the second control section 250. Components included in the first control section 230 and the second control section 250 will be described in detail with reference to FIGS. 20, 21 and 22. FIG. 6 shows the control signal from the external input terminal EIN leading directly to the first control section 230, the second control section 250 and the analog signal output section 270. It will be understood that the control signal may be provided with an addressing functionality to address one of the first control section 230, the second control section 250 and the analog signal output section 270, or a switch may be provided to direct the control signal to the appropriate one of the first control section 230, the second control section 250 and the analog signal output section 270.

The analog signal output section 270 may output an analog signal. The analog signal may be generated based on current provided from the current cell array 210. In some exemplary embodiments, the analog signal may be output through a first output terminal N1 and a second output terminal N2. A first reference signal ROUT1 which is an analog signal may be output from the first output terminal N1. A second reference signal ROUT2 which is an analog signal may be output from the second output terminal N2. In some exemplary embodiments, the analog signal output section 270 may output two analog signals. Each of the first reference signal ROUT1 and the second reference signal ROUT2 may be one of a 4T ramp signal illustrated in FIG. 4 and a 3T ramp signal illustrated in FIG. 5.

In some exemplary embodiments, the analog signal output section 270 may include a first output route R1, a second output route R2, a third output route R3, and a switch section 272. The first output route R1 may provide the first reference signal ROUT1 to the first output terminal N1. The second and third output routes R2 and R3 may provide the second reference signal ROUT2 to the second output terminal N2.

The switch section 272 may control a connection between the second output terminal N2 and the second output route R2 or the third output route R3. That is, one of the second output route R2 and the third output route R3 may be connected to the second output terminal N2 through the switch section 272. The second reference signal ROUT2 may be transferred from the current cells to the second output terminal N2 through one of the second output route R2 and the third output route R3, according to a control of the switch section 272.

In some exemplary embodiments, the analog signal output section 270 may receive an external control signal through the external input terminal EIN. For instance, the switch section 272 may connect one of the second output route R2 and the third output route R3 to the second output terminal N2 based on a mode selection signal provided through the external input terminal EIN. Configurations and operations of the switch section 272 will be described with reference to FIGS. 9 and 10.

A configuration of the analog signal generation circuit 200 illustrated in FIG. 6 is only an example. The analog signal generation circuit 200 may further include other components that are not illustrated in FIG. 6. For example, the analog signal generation circuit 200 may further include a sequence control section that controls a selection sequence of each of the current cells 211, an offset control section that adjusts an offset of the intensity of an analog signal output from the analog signal output section 270, and so on. That is, a configuration of the analog signal generation circuit 200 may be variously changed or modified. For instance, the analog signal output section 270 may be included in each current cell 211, instead of being separately implemented from the current cell array 210. One of ordinary skill in the art will understand that an analog signal generation section 200 with a changed configuration is included in the scope of the present inventive concept.

Figure 7:
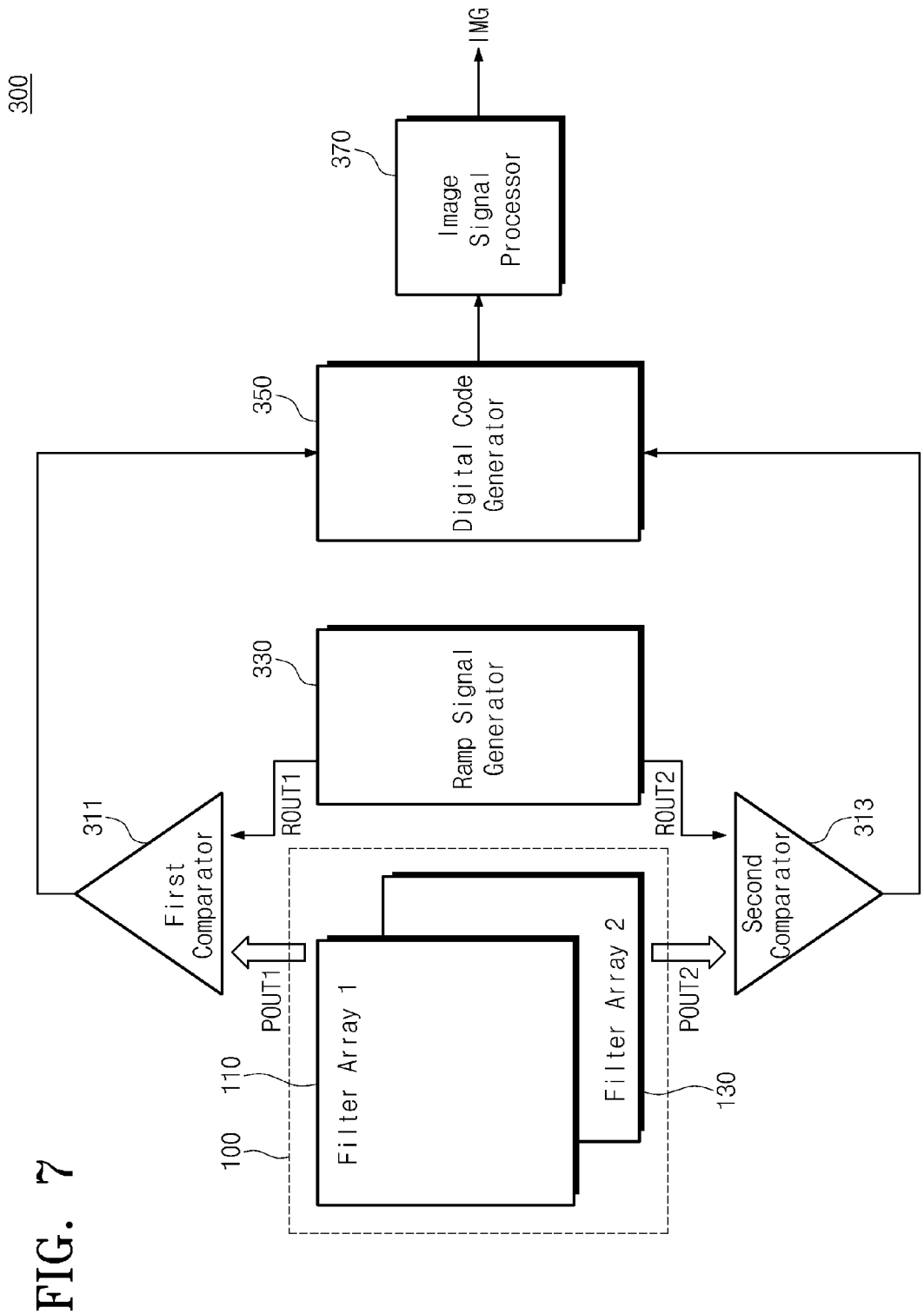
FIG. 7 is a block diagram illustrating an image sensor including an analog signal generation circuit according to an exemplary embodiment.

FIG. 7 is a block diagram illustrating an image sensor including an analog signal generation circuit according to an exemplary embodiment. An image sensor 300 may include a pixel array 100 (refer to FIG. 1), a first comparator 311, a second comparator 313, a ramp signal generator 330, a digital code generator 350, and an image signal processor 370.

In some exemplary embodiments, the pixel array 100 may include, but is not limited to, a first filter array 110 (refer to FIG. 1) and a second filter array 130 (refer to FIG. 1). A configuration of the pixel array 100 has been described with reference to FIG. 1. The pixel array 100 may generate a first pixel signal POUT1 and a second pixel signal POUT2. The first pixel signal POUT1 is an analog signal that is generated based on light passing through the first filter array 110, and the second pixel signal POUT2 is an analog signal that is generated based on light passing through the second filter array 130. The first pixel signal POUT1 and the second pixel signal POUT2 may be provided to the first comparator 311 and the second comparator 313, respectively.

The ramp signal generator 330 may generate a first reference signal ROUT1 and a second reference signal ROUT2. In some exemplary embodiments, the ramp signal generator 330 may be implemented with an analog signal generation circuit 200 illustrated in FIG. 6. In some exemplary embodiments, each of the first reference signal ROUT1 and the second reference signal ROUT2 may be one of a 4T ramp signal described with reference to FIG. 4 and a 3T ramp signal described with reference to FIG. 5. The first reference signal ROUT1 and the second reference signal ROUT2 may be provided to the first comparator 311 and the second comparator 313, respectively.

The first comparator 311 may receive the first pixel signal POUT1 and the first reference signal ROUT1. The first comparator 311 may compare the intensity of the first pixel signal POUT1 and the intensity of the first reference signal ROUT1. The second comparator 313 may receive the second pixel signal POUT2 and the second reference signal ROUT2. The second comparator 313 may compare the intensity of the second pixel signal POUT2 and the intensity of the second reference signal ROUT2. Comparison results of the first comparator 311 and the second comparator 313 may be provided to the digital code generator 350.

The digital code generator 350 may generate a digital code based on the provided comparison results. The digital code generator 350 may generate a digital signal of which the digital value varies according to the intensity of each of the first pixel signal POUT1 and the second pixel signal POUT2. The image signal processor 370 may generate image information IMG based on the digital signal generated by the digital code generator 350.

A configuration of the image sensor 300 illustrated in FIG. 7 is an example. The image sensor 300 may further include other components that are not illustrated in FIG. 7. For instance, the image sensor 300 may further include a sample/hold circuit that buffers data corresponding to each of the first pixel signal POUT1 and the second pixel signal POUT2, a timing controller that controls a signal output of each component, and so on.

The image sensor 300 may omit one or more components of FIG. 7. For instance, the image signal processor 370 may be separately implemented from the image sensor 300. In some exemplary embodiments, for example when a handheld electronic device is used, the image signal processor 370 may be separately implemented from the image sensor 300. In such a case, the image signal processor 370 may be implemented on an application processor.

A type of the image sensor 300 may vary. For instance, the image sensor 300 may be an organic sensor, a silicon sensor, or another type of sensor.

Figure 8:
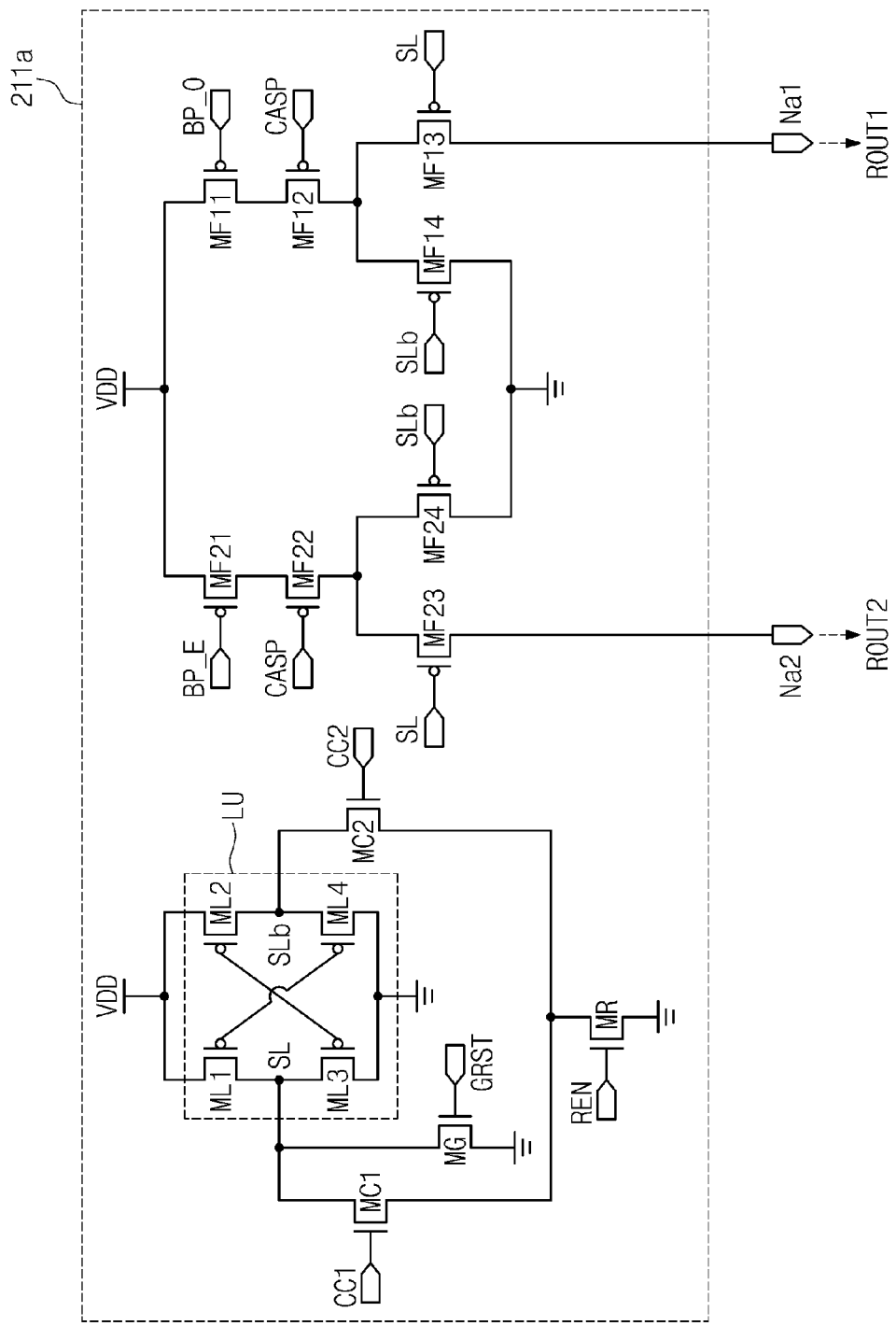
FIG. 8 is a diagram illustrating a current cell of an analog signal generation circuit according to an exemplary embodiment.

FIG. 8 is a diagram illustrating a current cell of an analog signal generation circuit. As an example, each of the current cells 211 (refer to FIG. 6) may have a configuration of a current cell 211a illustrated in FIG. 8. The current cell 211a may be controlled by a first control signal generated by a first control section 230 (refer to FIG. 6) and a second control signal generated by a second control section 250 (refer to FIG. 6). The current cell 211a may generate current or not generate current based on the first control signal and the second control signal. Current may flow or not flow through the current cell 211a based on the first control signal and the second control signal.

Column selection transistors MC1 and MC2 may be turned on or off in response to respective column control signals CC1 and CC2 included in the first control signal. A row selection transistor MR may be turned on or off in response to a row control signal REN included in the second control signal. The current cell 211a may be selected to be controlled in response to the column control signals CC1 and CC2 and the row control signal REN.

A latch unit LU may be connected between a terminal supplied with a driving voltage VDD, and a ground terminal. For instance, the latch unit LU may include latch transistors ML1, ML2, ML3 and ML4. The latch unit LU may generate cell selection signals SL and SLb.

Current control transistors MF11 and MF12 may be turned on or off in response to driving signals BP_O and CASP, respectively. Current control transistors MF21 and MF22 may be turned on or off in response to driving signals BP_E and CASP, respectively. The driving signals BP_O, BP_E, and CASP may be provided from a bias control circuit which is separately implemented from an analog signal generation circuit 200 (refer to FIG. 6). Descriptions of the bias control circuit and functions of the driving signals BP_O, BP_E, and CASP are omitted for conciseness.

Current control transistors MF13 and MF14 may be turned on or off in response to the cell selection signals SL and SLb generated by the latch unit LU. Current that is used to generate a first reference signal ROUT1 may be provided or not provided to a first output terminal Na1 according to operations of the current control transistors MF11, MF12, MF13 and MF14. Current control transistors MF23 and MF24 may be turned on or off in response to the cell selection signals SL and SLb generated by the latch unit LU. Current that is used to generate a second reference signal ROUT2 may be provided or not provided to a second output terminal Na2 according to operations of the current control transistors MF21, MF22, MF23 and MF24. With the above description, current may flow or not flow through the current cell 211a based on the column control signals CC1 and CC2 included in the first control signal and the row control signal REN included in the second control signal.

That is, each of current cells 211 may have one of two states. Hereinafter, two states that each current cell 211 may have are referred to as an "initialized state" and a "transition state". As will be described later, when a 4T ramp signal is generated as the first reference signal ROUT1 and the second reference signal ROUT2, the current cell 211 may generate current at the initialized state and not generate current at the transition state. On the other hand, when a 3T ramp signal is generated as the first reference signal ROUT1 and the second reference signal ROUT2, the current cell 211 may generate current at the transition state and not generate current at the initialized state.

The current cell 211a may include a global reset transistor MG. The global reset transistor MG may be turned on or off in response to a global reset signal GRST. The current cell 211a may be controlled to have the initialized state according to an operation of the global reset transistor MG. That is, a state of the current cell 211a may be initialized based on the global reset signal GRST.

When each current cell 211 has a configuration illustrated in FIG. 8, an analog signal generation circuit 200 may have limitation in terms of functions and configurations. Once the current cell 211a is designed, waveforms of the first reference signal ROUT1 and the second reference signal ROUT2 respectively output from the first output terminal Na1 and the second output terminal Na2 are uniquely determined. That is, once the current cell 211a is designed, waveforms of the first reference signal ROUT1 and the second reference signal ROUT2 are not changed, thereby decreasing the flexibility in using the current cell 211a. Accordingly, in order to selectively generate one of analog signals having different waveforms, each current cell 211 should include a plurality of current cells 211a, or a plurality of analog signal generation circuits 200 should be provided. Moreover, each current cell 211 is configured to include the global reset transistor MG for initializing a state of the current cell 211a. Accordingly, when each current cell 211 has a configuration illustrated in FIG. 8, an area occupied by a chip including the analog signal generation circuit 200 increases.

Figure 9:
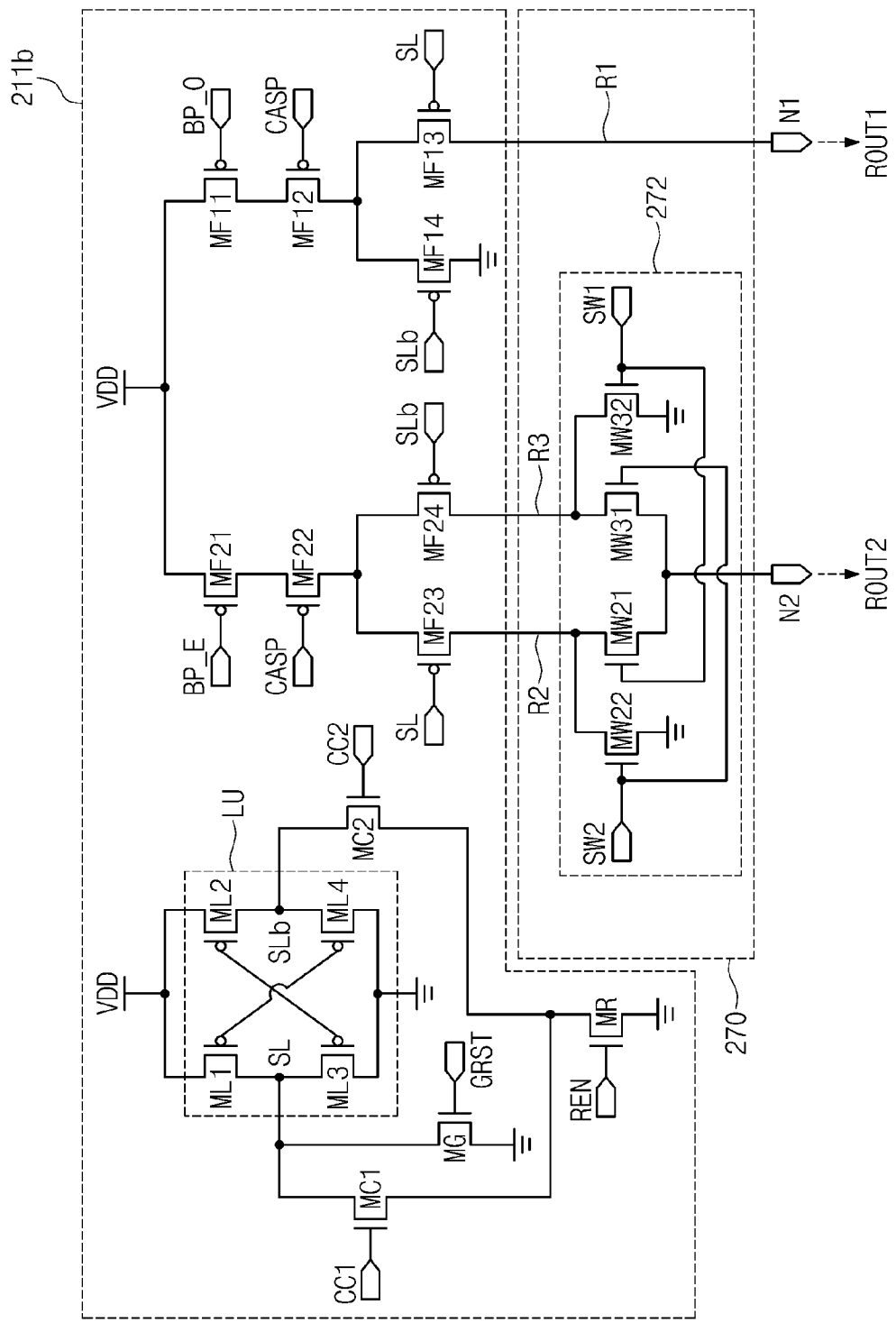
FIG. 9 is a diagram illustrating a current cell of an analog signal generation circuit according to an exemplary embodiment.

FIG. 9 is a diagram illustrating a current cell of an analog signal generation circuit according to an exemplary embodiment. In some exemplary embodiments, each current cell 211 may have a configuration of a current cell 211b illustrated in FIG. 9. A configuration of the current cell 211b illustrated in FIG. 9 is the same as that of a current cell 211a illustrated in FIG. 8. However, a switch section 272 is connected between the current cell 211b and first and second output terminals N1 and N2. Descriptions within an overlapped range with descriptions on FIG. 8 are omitted for conciseness.

As described with reference to FIG. 6, the current cell 211b may be connected to an analog signal output section 270. The analog signal output section 270 may output a first reference signal ROUT1 and a second reference signal ROUT2 through the first output terminal N1 and the second output terminal N2, respectively. Each of the first reference signal ROUT1 and the second reference signal ROUT2 may be one of a 4T ramp signal described with reference to FIG. 4 and a 3T ramp signal described with reference to FIG. 5.

As described with reference to FIG. 6, the analog signal output section 270 may include a first output route R1, a second output route R2, a third output route R3, and a switch section 272. The first output route R1 may provide current that is used to generate the first reference signal ROUT1 to the first output terminal N1. The second output route R2 and the third output route R3 may provide current that is used to generate the second reference signal ROUT2 at the second output terminal N2.

In some exemplary embodiments, a current control transistor MF13 may be connected with the first output route R1. The current that is used to generate the first reference signal ROUT1 may be provided or not provided to the first output terminal N1 through the first output route R1, according to operations of current control transistors MF11, MF12, MF13 and MF14.

In some exemplary embodiments, a current control transistor MF23 and a current control transistor MF24 may be connected with the second output route R2 and the third output route R3, respectively. The switch section 272 may control a connection between the second output terminal N2, and the second output route R2 and the third output route R3. One of the second output route R2 and the third output route R3 may be connected to the second output terminal N2 through the switch section 272. The current that is used to generate the second reference signal R2 may be provided or not provided to the second output terminal N2 through one of the second output route R2 and the third output route R3, according to the control of the switch section 272 and operations of the current control transistors MF21, MF22, MF23 and MF24. In some exemplary embodiments, the switch section 272 may connect one of the second output route R2 and the third output route R3 to the second output terminal N2 based on a mode selection signal. Configurations and operations of the switch section 272 will be described with reference to FIG. 10.

When each current cell 211 has a configuration of a current cell 211b illustrated in FIG. 9, a waveform of the second reference signal ROUT2 output from the second output terminal N2 may vary. That is, one of analog signals having different waveforms may be selectively generated as the second reference signal ROUT2. Thus, it is possible to improve the flexibility in using the current cell 211b.

In some exemplary embodiments, the analog signal generation circuit 200 including the current cell 211b illustrated in FIG. 9 may be used as a ramp signal generator 330 (refer to FIG. 7) of an image sensor 300 (refer to FIG. 7). In this exemplary embodiment, one of the 4T ramp signal and the 3T ramp signal may be selectively generated as the second reference signal ROUT2. With this exemplary embodiment, it is possible to freely select a configuration of a photosensitive element 151 (refer to FIG. 1) of a pixel array 100 (refer to FIG. 1).

Figure 10:
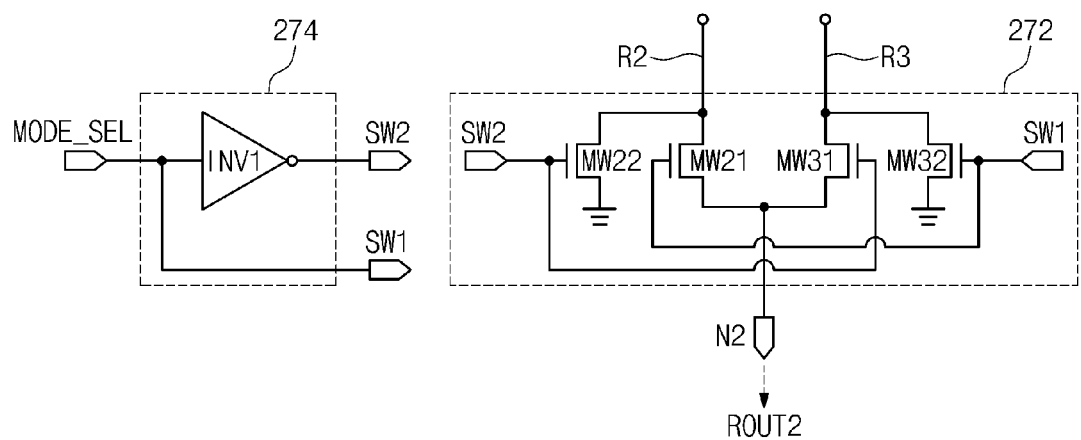
FIG. 10 is a diagram illustrating an analog signal output section of an analog signal generation circuit according to an exemplary embodiment.

FIG. 10 is a diagram illustrating an analog signal output section of an analog signal generation circuit according to an exemplary embodiment. As set forth above, an analog signal output section 270 may include a switch section 272. In some exemplary embodiments, the analog signal output section 270 may further include a switch signal generation section 274.

The switch signal generation section 274 may receive a mode selection signal MODE_SEL. For instance, the mode selection signal MODE_SEL may be provided through an external input terminal EIN (refer to FIG. 6). However, the present inventive concept is not limited thereto. The switch signal generation section 274 may generate a first switch signal SW1 and a second switch signal SW2 based on the mode selection signal MODE_SEL.

In some exemplary embodiments, a logical value corresponding to the first switch signal SW1 may be complementary to a logical value corresponding to the second switch signal SW2. For instance, the first switch signal SW1 may have the same logical value as a logical value corresponding to the mode selection signal MODE_SEL, and the second switch signal SW2 may have a logical value which is an inverted version of the logical value corresponding to the mode selection signal MODE_SEL. In some exemplary embodiments, the switch signal generation section 274 may include an inverter INV1.

However, a configuration of the switch signal generation section 274 may be changed or modified. As well as the mode selection signal MODE_SEL, another signal may be provided to the switch signal generation section 274 to produce the first switch signal SW1 and the second switch signal SW2. That is, a configuration of the switch signal generation section 274 illustrated in FIG. 10 is an example, and the preset inventive concept is not limited thereto. One of ordinary skill in the art will understand that a switch signal generation section 274 with a changed configuration is included in the inventive concept.

The first switch signal SW1 and the second switch signal SW2 may be provided to the switch section 272. As described with reference to FIG. 9, the switch section 272 may control a connection between the second output terminal N2 and the second output route R2 and the third output route R3 and. The first switch signal SW1 may control operations of switch transistors MW21 and MW32, thus, a connection between the second output route R2 and the second output terminal N2 may be controlled by the first switch signal SW1. Further, the second switch signal SW2 may control operations of switch transistors MW22 and MW31, thus, a connection between the third output route R3 and the second output terminal N2 may be controlled by the second switch signal SW2.

With the above description, the switch section 272 may connect one of the second output route R2 and the third output route R3 to the second output terminal N2 based on the mode selection signal MODE_SEL. In some exemplary embodiments, a waveform of a second reference signal ROUT2 output from the second output terminal N2 may be selected based on the mode selection signal MODE_SEL.

However, configurations and a control method of the switch section 272 illustrated in FIGS. 9 and 10 are just an example. Change or modification on configurations and a control method of the switch section 272 may be variously made. One of ordinary skill in the art will understand that a switch section 272 having a changed configuration or be controlled using another method, and that a changed configuration or different method are included in the inventive concept.

Figures 11A, 11B, 11C:
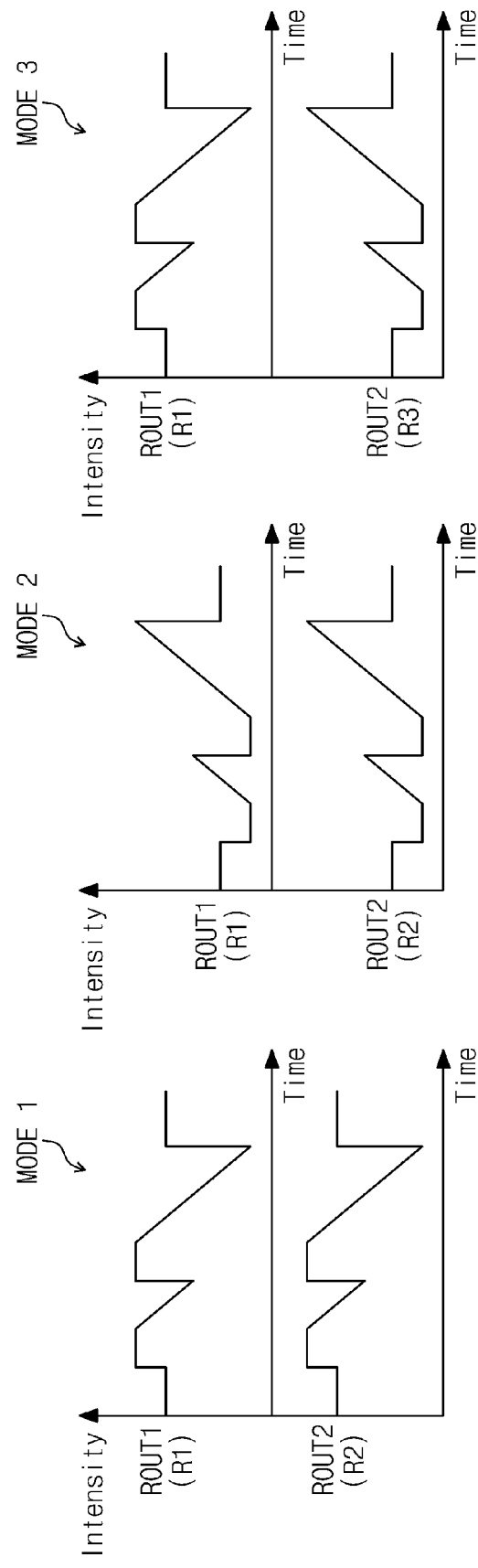
FIGS. 11A, 11B and 11C are graphs illustrating waveforms of an analog signal generated according to an exemplary embodiment.

FIGS. 11A to 11C are graphs illustrating waveforms of an analog signal generated according to an exemplary embodiment. In particular, FIGS. 11A to 11C illustrate waveforms of first reference signal ROUT1 and the second reference signal ROUT2 that are generated when an analog signal generation circuit 200 (refer to FIG. 6) according to an exemplary embodiment is used as a ramp signal generator 330 (refer to FIG. 7) of an image sensor 300 (refer to FIG. 7).

In some exemplary embodiments, an operation mode of an analog signal generation circuit 200 may be changed based on a mode selection signal MODE_SEL (refer to FIG. 10). In FIGS. 11A to 11C, it is assumed that the analog signal generation circuit 200 has three operation modes.

In a first mode MODE1 shown in FIG. 11A, a 4T ramp signal may be generated as a first reference signal ROUT1 and a second reference signal ROUT2. In the first mode MODE1, the first reference signal ROUT1 may be generated through a first output route R1, and the second reference signal ROUT2 may be generated through a second output route R2. In a second mode MODE2 shown in FIG. 11B, a 3T ramp signal may be generated as the first reference signal ROUT1 and the second reference signal ROUT2. In the second mode MODE2, the first reference signal ROUT1 may be generated through the first output route R1, and the second reference signal ROUT2 may be generated through the second output route R2. In a third mode MODE3 shown in FIG. 11C, the 4T ramp signal may be generated through the first output route R1 as the first reference signal ROUT1. In the third mode MODE3, the 3T ramp signal may be generated through a third output route R3 as the second reference signal ROUT2.

If each current cell 211 (refer to FIG. 6) has a configuration of a current cell 211a illustrated in FIG. 8, waveforms of the first reference signal ROUT1 and the second reference signal ROUT2 are uniquely determined. On the other hand, when each current cell 211 has a configuration of a current cell 211b illustrated in FIG. 9, an output route used to generate the second reference signal ROUT2 and a waveform of the second reference signal ROUT2 may vary. For instance, referring to the first mode MODE1 in FIG. 11A and the third mode MODE3 in FIG. 11C, a waveform of the first reference signal ROUT1 is not changed, but a waveform of the second reference signal ROUT2 is changed. Further, referring to the third mode MODE3 in FIG. 11C, a waveform of the first reference signal ROUT1 and a waveform of the second reference signal ROUT2 are different from each other. Accordingly, when each current cell 211 has a configuration of the current cell 211b illustrated in FIG. 9, flexibility in using of the current cell 211b may be improved. Further, it is possible to freely select a configuration (refer to FIGS. 2 and 3) of a photo-sensitive element 151 (refer to FIG. 1) of a pixel array 100 (refer to FIG. 1).

However, the number of modes, a method of deciding a mode, a waveform of an analog signal generated at each mode, and an output route used to generate the second reference signal ROUT2 set forth in FIGS. 11A to 11C may be changed. FIG. 11A to 11C are provided to help to understand the present inventive concept and not to limit the inventive concept.

Figure 12:
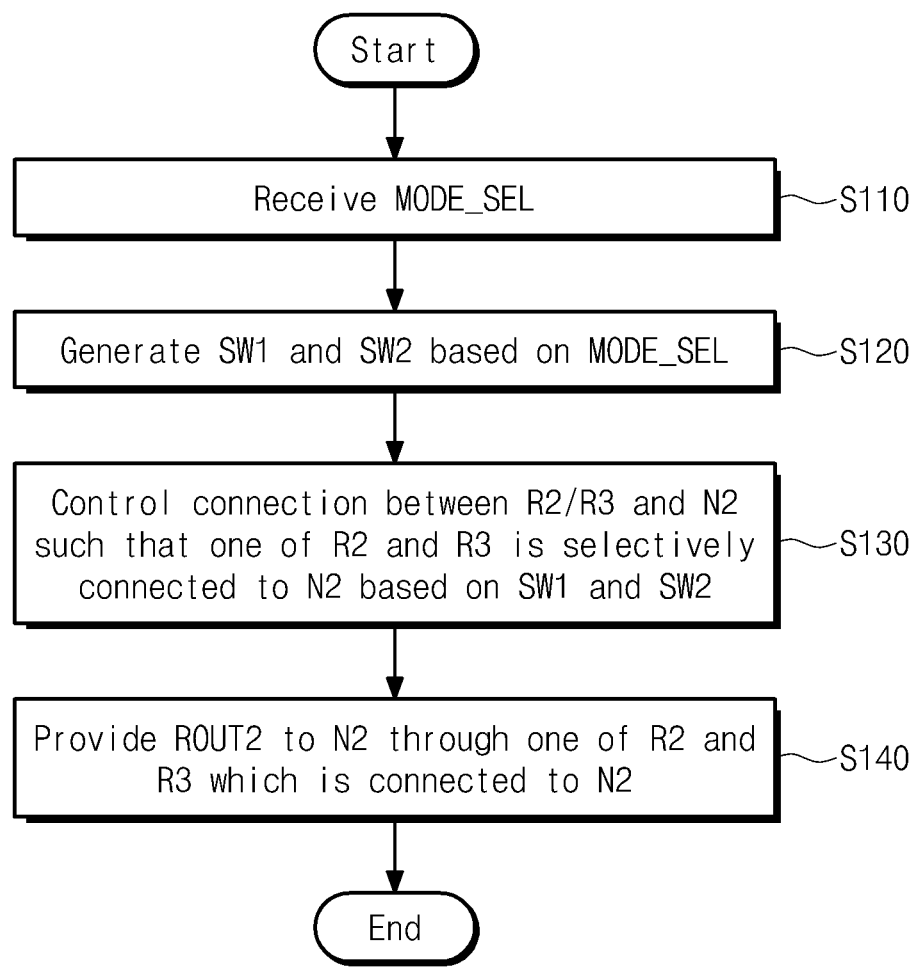
FIG. 12 is a flowchart describing a method of selecting a waveform of an analog signal generated according to an exemplary embodiment.

FIG. 12 is a flow chart describing a method of selecting a waveform of an analog signal according to an exemplary embodiment.

In operation S110, a mode selection signal MODE_SEL may be provided. For instance, the mode selection signal may be provided from an external input terminal EIN (refer to FIG. 6) to a switch signal generation section 274 (refer to FIG. 10).

In operation S120, a first switch signal SW1 and a second switch signal SW2 may be generated. For instance, the switch signal generation section 274 may generate the first switch signal SW1 and the second switch signal SW2. The first switch signal SW1 and the second switch signal SW2 may be generated based on the mode selection signal MODE_SEL provided in operation S110.

In operation S130, a connection between second and third output routes R2 and R3 and a second output terminal N2 may be controlled. In particular, one of the second output route R2 and the third output route R3 may be selectively connected to the second output terminal N2. The connection between the second and third output routes R2 and R3 and the second output terminal N2 may be controlled based on the first switch signal SW1 and the second switch signal SW2 which are generated in operation S120.

In operation S140, a second reference signal ROUT2 may be provided to the second output terminal N2. In particular, the second reference signal ROUT2 may be provided to the second output terminal N2 through one output route which is connected to the second output terminal N2 from among the second output route R2 and the third output route R3. One of the second output route R2 and the third output route R3 may be connected to the second output terminal N2 based on the mode selection signal MODE_SEL. Further, a waveform of the second reference signal ROUT2 output from the second output terminal N2 may be selected based on the mode selection signal MODE_SEL.

Figure 13:
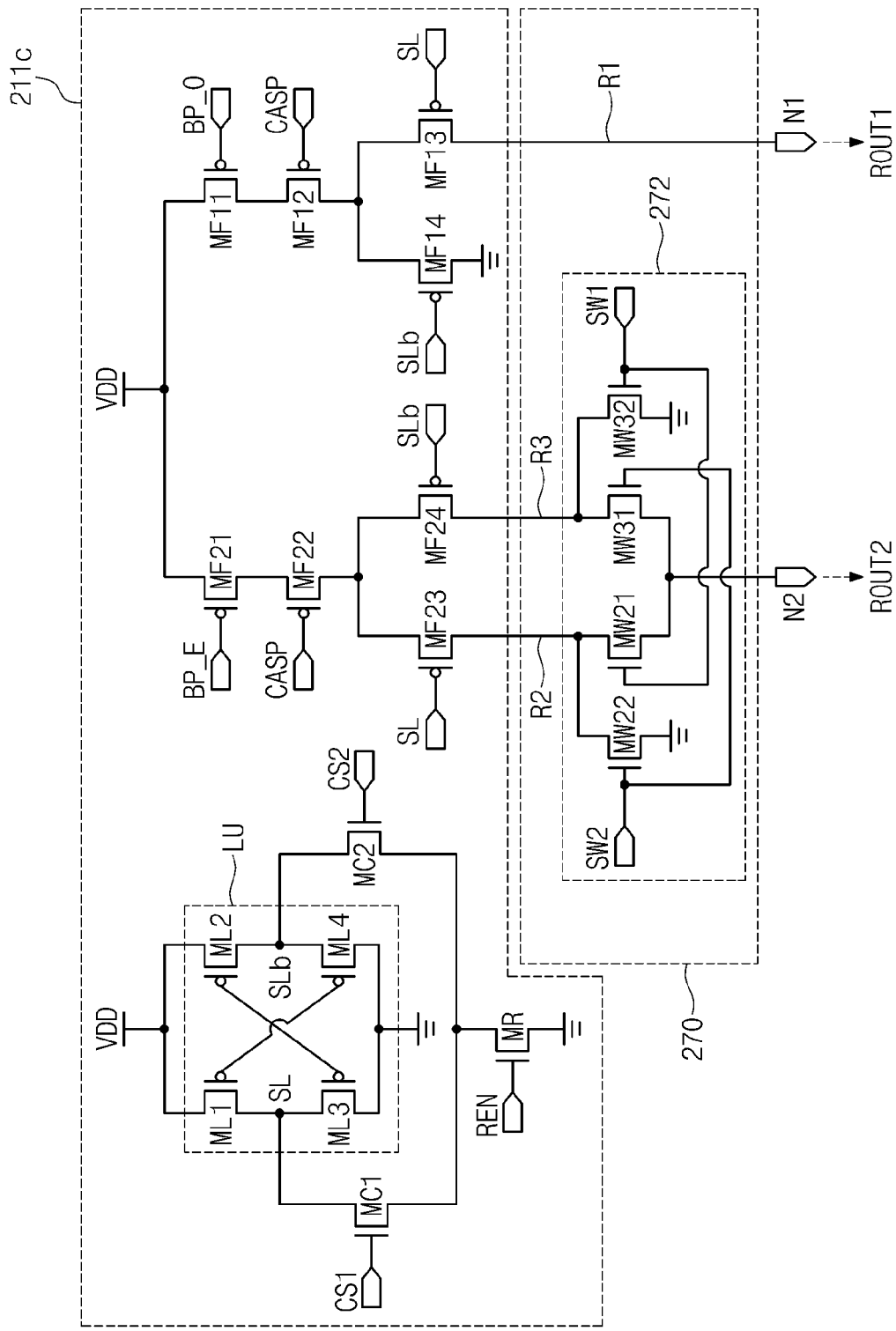
FIG. 13 is a diagram illustrating a current cell of an analog signal generation circuit according to an exemplary embodiment.

FIG. 13 is a diagram illustrating a current cell of an analog signal generation circuit according to an exemplary embodiment. In some exemplary embodiments, each current cell 211 may have a configuration of a current cell 211c illustrated in FIG. 13. A configuration of the current cell 211c of FIG. 13 is obtained by removing a global reset transistor MG (refer to FIG. 9) from a configuration of a current cell 211b illustrated in FIG. 9. Further, a switch section 272 may be connected between the current cell 211c and first and second output terminals N1 and N2. Descriptions that would overlap with descriptions on FIGS. 8 and 9 are omitted.

In some exemplary embodiments, a state of the current cell 211c may be initialized without using the global reset transistor MG. In particular, a state of the current cell 211c may be controlled based on a first cell state setting signal CS1 and a second cell state setting signal CS2. The first cell state setting signal CS1 and the second cell state setting signal CS2 may be included in a first control signal generated by a first control section 230 (refer to FIG. 6). The terms "first cell state setting signal CS1" and "second cell state setting signal CS2" are to help in understanding the present inventive concept and not to limit the inventive concept. Functions of the first cell state setting signal CS1 and the second cell state setting signal CS2 which will be described below may be interchanged.

In some exemplary embodiments, a logical value corresponding to the first cell state setting signal CS1 may be complementary to a logical value corresponding to the second cell state setting signal CS2. The current cell 211c selected to be controlled by the first control signal and a second control signal, which are respectively generated by the first control section 230 and a second control section 250 (refer to FIG. 6), may have an initialized state based on the first cell state setting signal CS1. Further, the current cell 211c selected to be controlled by the first control signal and the second control signal may have a transition state based on the second cell state setting signal CS2. A method of controlling current cells 211 having a configuration of the current cell 211c of FIG. 13 based on the first cell state setting signal CS1 and the second cell state setting signal CS2 will be further described with reference to FIGS. 14 to 19.

As will be described later, when a 4T ramp signal is generated as a first reference signal ROUT1 or a second reference signal ROUT2, the current cell 211c may be controlled to generate current at the initialized state and not to generate current at the transition state. On the other hand, when a 3T ramp signal is generated as the first reference signal ROUT1 or the second reference signal ROUT2, the current cell 211c may be controlled not to generate current at the initialized state and to generate current at the transition state. That is, the initialized state and the transition are different from each other. The intensity of current flowing through a current cell array 210 (refer to FIG. 6) may vary according to the number of current cells which generate current from among the current cells 211 having a configuration of the current cell 211c of FIG. 13.

As set forth above, a state of the current cell 211c may be initialized based on the first cell state setting signal CS1. Accordingly, it is possible to reset a state of the current cell 211c without using the global reset transistor MG. With this exemplary embodiment, the global reset transistor MG may be removed from the current cell 211c. Thus, it is possible to reduce an area occupied by an analog signal generation circuit 200 including the current cells 211, each having a configuration of the current cell 211c of FIG. 13, and a chip including the analog signal generation circuit 200. Further, it is possible to reduce a power consumed by a chip.

Figure 14:
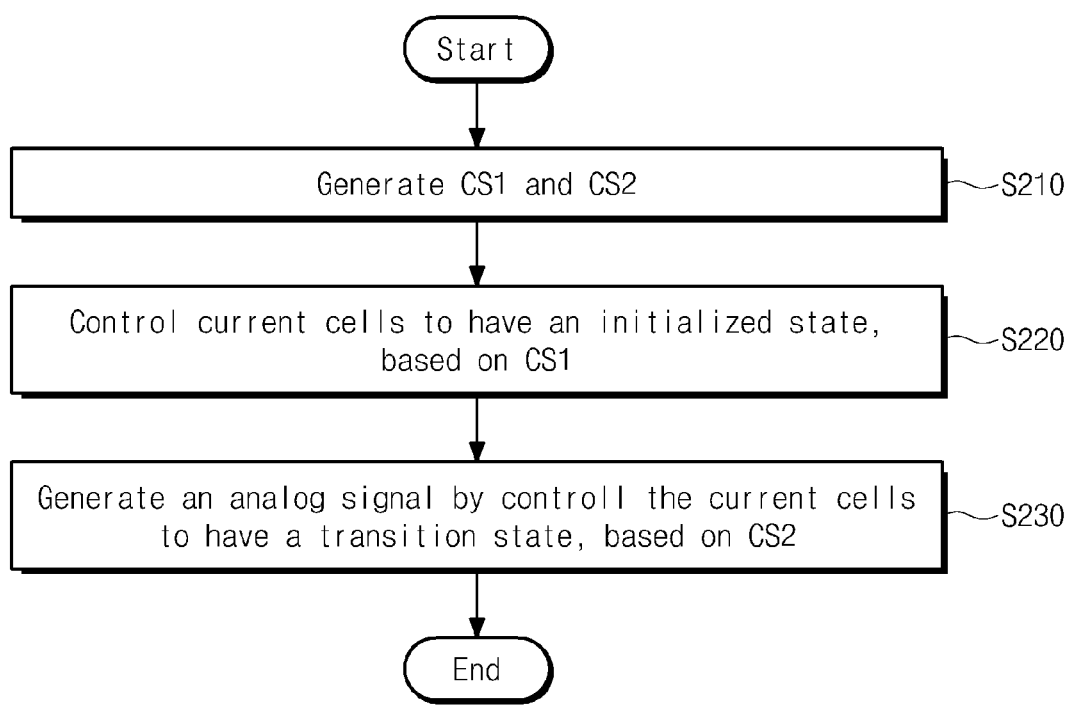
FIG. 14 is a flowchart describing a method of generating an analog signal according to an exemplary embodiment.

FIG. 14 is a flow chart describing a method of generating an analog signal according to an exemplary embodiment. In particular, an analog signal generating method of FIG. 14 may be performed by controlling a current cell array 210 (refer to FIG. 6) including a plurality of current cells (e.g., current cells 211 (refer to FIG. 6)) with a control signal (e.g., a first control signal generated by a first control section 230 (refer to FIG. 6) and a second control signal generated by a second control section 250 (refer to FIG. 6)).

In operation S210, a first cell state setting signal CS1 and a second cell state setting signal CS2 may be generated. The first cell state setting signal CS1 and the second cell state setting signal CS2 may be included in a control signal. For instance, the first cell state setting signal CS1 and the second cell state setting signal CS2 may be included in the first control signal generated by the first control section 230. In some exemplary embodiments, a logical value corresponding to the first cell state setting signal CS1 may be complementary to a logical value corresponding to the second cell state setting signal CS2.

In operation S220, the plurality of current cells may be controlled to have an initialized state. In particular, one of the current cells which is selected to be controlled by the control signal may be controlled to have an initialized state. In operation S220, the current cell selected to be controlled by the control signal may be controlled based on the first cell state setting signal CS1 generated in operation S210. In operation S220, each of the current cells may be controlled to generate current or not generate current.

In operation S230, an analog signal may be generated. The analog signal may be generated by controlling the current cells to have a transition state. In particular, one of the current cells which is selected to be controlled by the control signal may be controlled to have a transition state. As described above, the initialized state and the transition state are different from each other. In operation S230, a current cell selected to be controlled by the control signal may be controlled based on the second cell state setting signal CS2 generated in operation S210. In operation S230, each current cell may be controlled to generate current or not.

The process for controlling the current cells according to operations S220 and S230 will be further described with reference to FIGS. 15 to 18.

Figure 15:
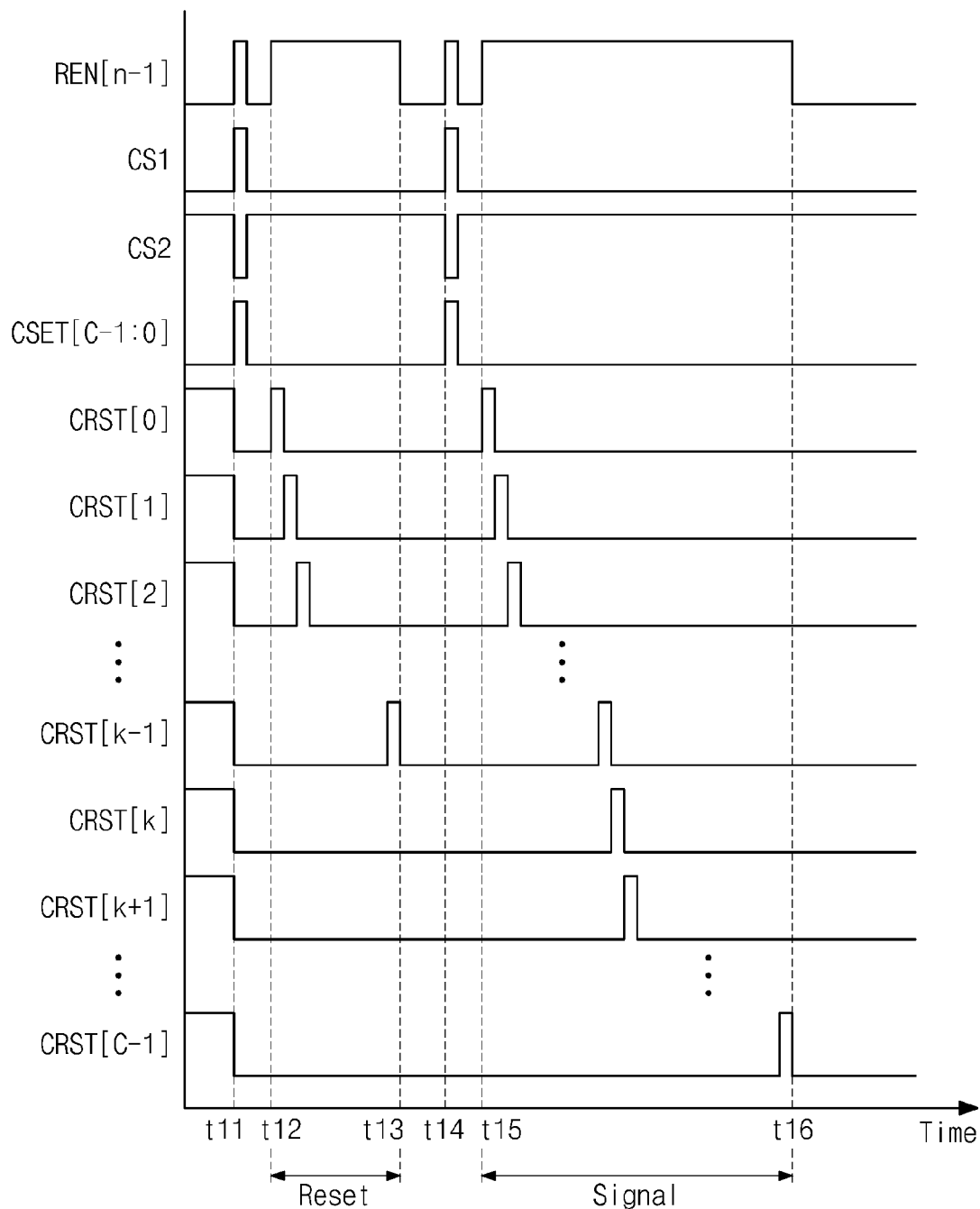
FIGS. 15 and 16 are timing diagrams for describing a procedure of generating a reference signal to be compared with an electric signal generated by a photo-sensitive element including four transistors.
Figure 16:
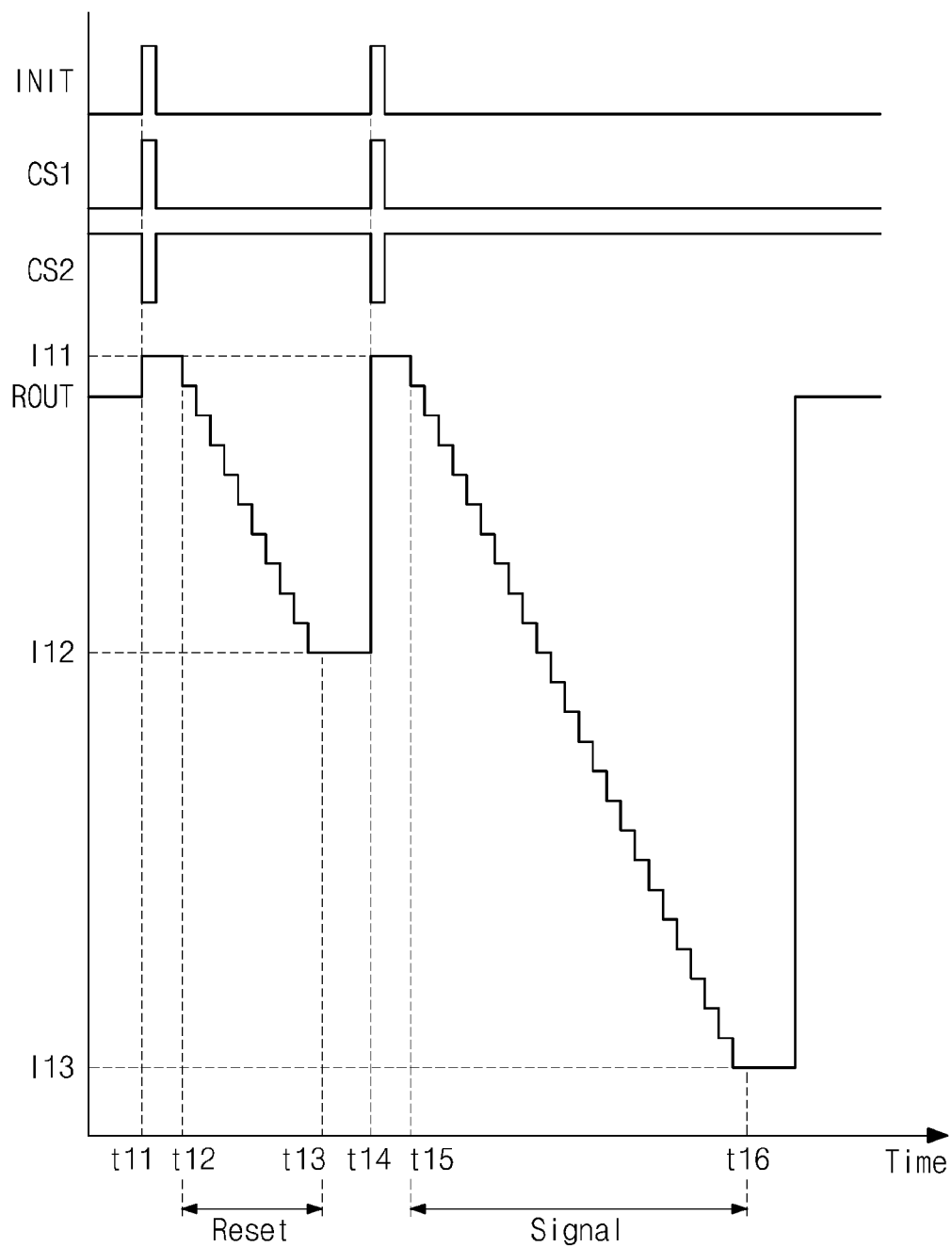

FIGS. 15 and 16 are timing diagrams for describing a procedure generating a reference signal ROUT to be compared with an electric signal (e.g., a pixel signal POUT described with reference to FIG. 2) generated by a photosensitive element including four transistors. A reference signal ROUT to be described with reference to FIGS. 15 and 16 is a 4T ramp signal having a waveform illustrated in FIG. 4. As described above, the intensity of the 4T ramp signal is compared with the intensity of an electric signal generated by a photo-sensitive element 151a with a 4T structure illustrated in FIG. 2.

Referring initially to FIG. 16, first, an initialization signal INIT may be provided to an analog signal generation circuit 200 (refer to FIG. 6). The initialization signal INIT is a trigger signal for controlling a current cell array 210 (refer to FIG. 6) to initialize a state of each of current cells 211 (refer to FIG. 6). That is, an operation of initializing a state of each current cell 211 may begin in response to the initialization signal INIT. In some exemplary embodiments, the initialization signal INIT may be provided through an external input terminal EIN (refer to FIG. 6) from a control circuit which is separately configured from the analog signal generation circuit 200. However, the present inventive concept is not limited thereto. For example, the initialization signal INIT may be generated within the analog signal generation circuit 200 when a threshold condition is satisfied. It is assumed that the initialization signal NIT is provided at time 't11' to help in understanding of the present inventive concept. However, this is only an example.

A logical value corresponding to a first cell state setting signal CS1 may be inverted based on the initialization signal INIT. For instance, the first cell state setting signal CS1 may have the intensity corresponding to logic '0' before time 't11', then at time 't11', the first cell state setting signal CS1 with the intensity corresponding to logic '1' may be pulsed. A logical value corresponding to the second cell state setting signal CS2 may be complementary to a logical value corresponding to the first cell state setting signal CS1. For instance, the second cell state setting signal CS2 may have the intensity corresponding to logic '1' before time 't11', then at time 't11', the second cell state setting signal CS2 with the intensity corresponding to logic '0' may be pulsed.

Turning to FIG. 15, at time 't11', initialized state setting signals CSET[C–1:0] may be generated, for instance, by a first control section 230 (refer to FIG. 6). The initialized state setting signals CSET[C–1:0] are signals for initializing states of the current cells 211. The initialized state setting signals CSET[C–1:0] may be generated based on the first cell state setting signal CS1. Generating the initialized state setting signals CSET[C–1:0] will be described in more detail with reference to FIG. 22. In particular, in order to generate a reference signal ROUT being a 4T ramp signal, each of the current cells 211 may be controlled to generate current at the initialized state. The initialized state setting signals CSET[C–1:0] may be provided to C columns of the current cell array 210 in order to initialize states of the current cells 211. Thus, the reference signal ROUT may have the first intensity I11 at time 't11' (refer to FIG. 16).

Transition state setting signals CRST[0] to CRST[k–1] may be generated from time 't12' to time 't13', for instance, by the first control section 230. The transition state setting signals CRST[0] to CRST[k–1] are signals for controlling the current cell array 210 such that each current cell 211 has a transition state. In particular, an interval between time 't12' and time 't13' is a time interval where a reset level of an electric signal generated by the photo-sensitive element 151a with the 4T structure is determined (see FIG. 16). The transition state setting signals CRST[0] to CRST[k–1] may be generated based on the second cell state setting signal CS2. Generating the transition state setting signals CRST[0] to CRST[k–1] will be described in more detail with reference to FIG. 22. In particular, in order to generate the reference signal ROUT being the 4T ramp signal, each of the current cells 211 may be controlled not to generate current at the transition state.

The transition state setting signals CRST[0] to CRST[k–1] may be provided to k columns of the current cell array 210 in order to control the current cell array 210 such that current cells corresponding to the k columns have the transition state, from time 't12' to time 't13', where k<C and C is the total number of columns of current cells. In particular, after all the current cells 211 have the initialized state, each of the current cells corresponding to the k columns may be successively controlled to have the transition state by the transition state setting signals CRST[0] to CRST[k–1]. The intensity of current provided from the current cell array 210 to an analog signal output section 270 (refer to FIG. 6) may vary (herein, may decrease) according to the number of current cells controlled to have the transition state. That is, the intensity of the reference signal ROUT may vary according to the number of current cells controlled to have the transition state. Thus, the intensity of the reference signal ROUT may stepwise decrease within an intensity interval from 't12' to 't13' that is defined by the first intensity I11 and second intensity I12 (see FIG. 16). Adjusting the intensity of current provided from the current cell array 210 will be further described with reference to FIG. 19.

When states of the current cells 211 are initialized by the initialized state setting signals CSET[C–1:0], a row control signal REN[n–1] may be provided to an nth row of the current cell array 210. Also, the row control signal REN[n–1] may be provided to the nth row of the current cell array 210 while the current cells 211 corresponding to the k columns are being successively controlled to have the transition state by the transition state setting signals CRST[0] to CRST[k–1]. For instance, the row control signal REN[n–1] may be provided from a second control section 250 (refer to FIG. 6). Current cells selected by the row control signal REN[n–1] may be controlled to have the initialized state or the transition state. That is, a current cell that is selected by a first control signal including the first and second cell state setting signals CS1 and CS2 and a second control signal including the row control signal REN[n–1] may be controlled to have the initialized state or the transition state.

After a time interval for determining a reset level elapses, a signal level of an electric signal generated by the photo-sensitive element 151a with the 4T structure may be determined. Turning to FIG. 16, at time 't14', the initialization signal INIT may be provided again. An operation of initializing states of the current cells 211 may begin in response to the initialization signal INIT.

At time 't14', the first cell state setting signal CS1 with the intensity corresponding to logic '1' may be pulsed based on the initialization signal INIT. Further, at time 't14', the second cell state setting signal CS2 with the intensity corresponding to logic '0' may be pulsed.

Turning to FIG. 15, at time 't14', the initialized state setting signals CSET[C–1:0] may be generated. The initialized state setting signals CSET[C–1:0] may be generated based on the first cell state setting signal CS1. As set forth above, in order to generate the reference signal ROUT being the 4T ramp signal, each of the current cells 211 may be controlled to generate current at the initialized state. In order to initialize states of the current cells 211, the initialized state setting signals CSET[C–1:0] may be provided to the C columns of the current cell array 210. Thus, the reference signal ROUT may have the first intensity I11 at time 'T14'.

The transition state setting signals CRST[0] to CRST[C–1] may be generated, from time 't15' to time 't16'. In particular, an interval between time 't15' and time 't16' is a time interval where a signal level of an electric signal generated by the photo-sensitive element 151a with the 4T structure is determined. The transition state setting signals CRST[0] to CRST[C–1] may be generated based on the second cell state setting signal CS2. As set forth above, in order to generate the reference signal ROUT being the 4T ramp signal, each of the current cells 211 may be controlled not to generate current at the transition state.

The transition state setting signals CRST[0] to CRST[C−1] may be provided to the C columns of the current cell array 210 in order to control the current cell array 210 such that each of the current cells has the transition state, from time 't15' to time 't16'. Unlike the time interval for determining the reset level, the transition state setting signals CRST[0] to CRST[C−1] may be provided to current cells in C columns during the time interval for determining the signal level. In particular, after the current cells 211 have the initialized state, each of the current cells may be successively controlled to have the transition state based on the transition state setting signals CRST[0] to CRST[C−1]. The intensity of current provided from the current cell array 210 to the analog signal output section 270 may vary (herein, may decrease) according to the number of current cells controlled to have the transition state. That is, the intensity of the reference signal ROUT may vary according to the number of current cells controlled to have the transition state. Thus, the intensity of the reference signal ROUT may stepwise decrease from 't15' to 't16' within an intensity interval that is defined by the first intensity I11 and third intensity I13 (see FIG. 16).

When states of the current cells 211 are initialized by the initialized state setting signals CSET[C−1:0], the row control signal REN[n−1] may be provided to the nth row of the current cell array 210. Further, the row control signal REN[n−1] may be provided to the nth row of the current cell array 210 while the current cells 211 are being successively controlled to have the transition state by the transition state setting signals CRST[0] to CRST[C−1]. The current cells selected by the row control signal REN[n−1] may be controlled to have the initialized state or the transition state.

The row control signal REN[n−1] may be successively provided to the current cell array 210, from a first row to an nth row, where n<R and R denotes the total number of rows. Thus, an operation described with reference to FIGS. 15 and 16 may be performed with respect to each of n rows of the current cell array 210.

Figure 17:
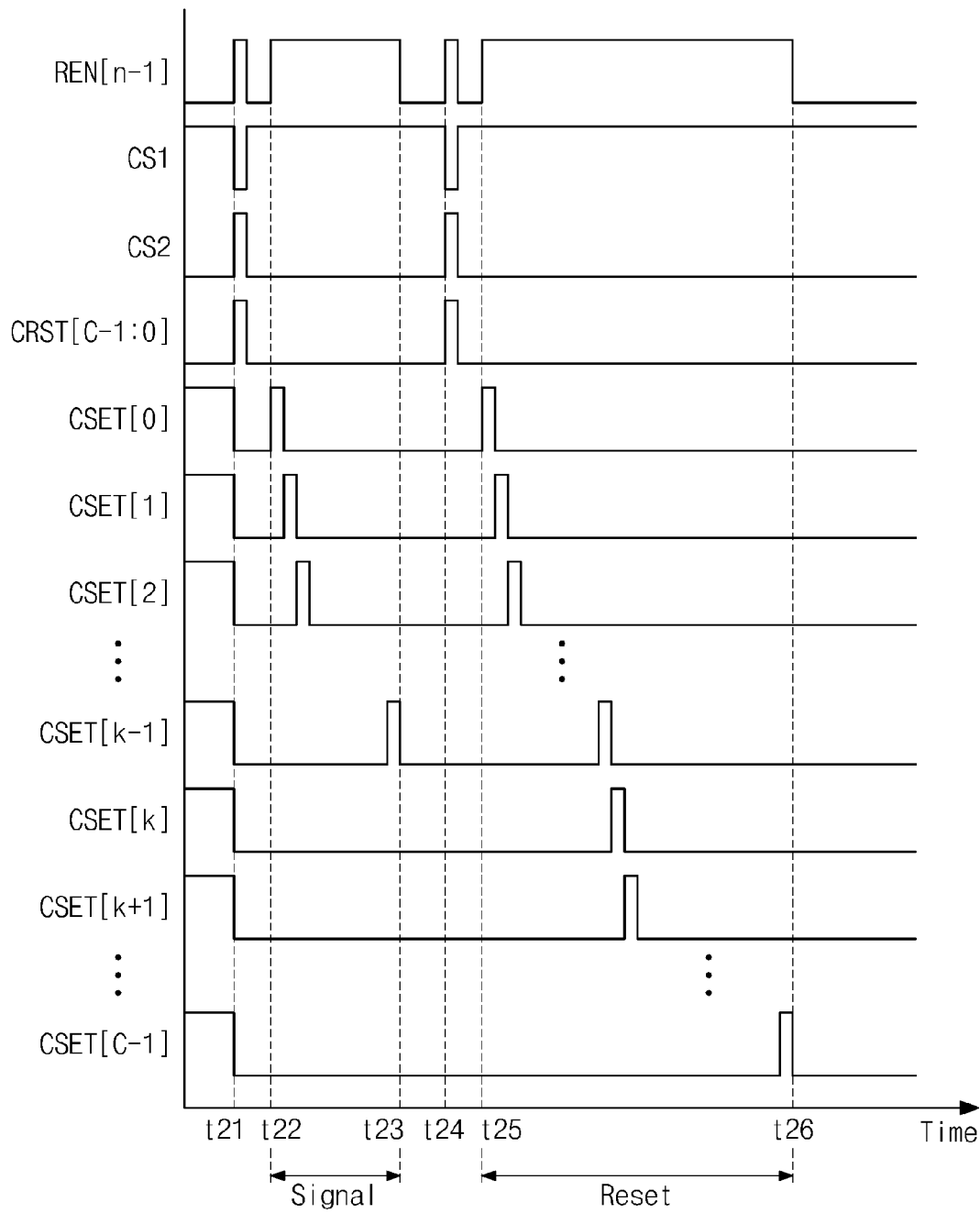
FIGS. 17 and 18 are timing diagrams for describing a procedure of generating a reference signal to be compared with an electric signal generated by a photo-sensitive element including three transistors.

FIGS. 17 and 18 are timing diagrams for describing a procedure generating a reference signal ROUT to be compared with an electric signal (e.g., a pixel signal POUT described with reference to FIG. 3) generated by a photo-sensitive element including three transistors. A reference signal ROUT to be described with reference to FIGS. 17 and 18 is a 3T ramp signal having a waveform illustrated in FIG. 5. As described above, the intensity of the 3T ramp signal is compared with the intensity of an electric signal generated by a photo-sensitive element 151b with a 3T structure illustrated in FIG. 3.

Turning to FIG. 18, first, an initialization signal INIT may be provided to an analog signal generation circuit 200 (refer to FIG. 6). As described above, the initialization signal INIT is a trigger signal for controlling a current cell array 210 (refer to FIG. 6) to initialize a state of each of current cells 211 (refer to FIG. 6). An operation of initializing a state of each current cell 211 may begin in response to the initialization signal INIT. It is assumed that the initialization signal INIT is provided at time 't21' to help in understanding the present inventive concept. However, this is only an example.

A logical value corresponding to a second cell state setting signal CS2 may be inverted based on the initialization signal INIT. For instance, the second cell state setting signal CS2 may have the intensity corresponding to logic '0' before time 't21', then at time 't21', the second cell state setting signal CS2 with the intensity corresponding to logic '1' may be pulsed. A logical value corresponding to a first cell state setting signal CS1 may be complementary to a logical value corresponding to the second cell state setting signal CS2. For instance, the first cell state setting signal CS1 may have the intensity corresponding to logic '1' before time 't21', then at time 't21', the first cell state setting signal CS1 with the intensity corresponding to logic '0' may be pulsed.

Turning to FIG. 17, at time 't21', initialized state setting signals CRST[C−1:0] may be generated, for instance, by a first control section 230 (refer to FIG. 6). The initialized state setting signals CRST[C−1:0] are signals for initializing states of the current cells 211. The initialized state setting signals CRST[C−1:0] may be generated based on the second cell state setting signal CS2. Unlike the description regarding FIGS. 15 and 16, in order to generate a reference signal ROUT being a 3T ramp signal, each of the current cells 211 may be controlled not to generate current at the initialized state. The initialized state setting signals CRST[C−1:0] may be provided to C columns of the current cell array 210 in order to initialize states of the current cells 211. Thus, the reference signal ROUT may have the first intensity I21 at time 't21'.

Transition state setting signals CSET[0] to CSET[k−1] may be generated from time 't22' to time 't23', for instance, by the first control section 230. The transition state setting signals CSET[0] to CSET[C−1] are signals for controlling the current cell array 210 such that each current cell 211 has a transition state. In particular, an interval between time 't22' and time 't23' is a time interval where a signal level of an electric signal generated by the photo-sensitive element 151b with the 3T structure is determined. The transition state setting signals CSET[0] to CSET[k−1] may be generated based on the first cell state setting signal CS1. Unlike the description regarding FIGS. 15 and 16, in order to generate the reference signal ROUT being the 3T ramp signal, each of the current cells 211 may be controlled to generate current at the transition state.

The transition state setting signals CSET[0] to CSET[k−1] may be provided to k columns of the current cell array 210 in order to control the current cell array 210 such that current cells corresponding to the k columns have the transition state, from time 't22' to time 't23', where k<C and where C is the total number of columns. In particular, after the current cells 211 have the initialized state, each of the current cells corresponding to the k columns may be successively controlled to have the transition state by the transition state setting signals CSET[0] to CSET[k−1]. The intensity of current provided from the current cell array 210 to an analog signal output section 270 (refer to FIG. 6) may vary (herein, may increase) according to the number of current cells controlled to have the transition state. That is, the intensity of the reference signal ROUT may vary according to the number of current cells controlled to have the transition state. Thus, the intensity of the reference signal ROUT may stepwise increase from 't22' to 't23' within an intensity interval that is defined by the first intensity I21 and second intensity I22.

When states of the current cells 211 are initialized by the initialized state setting signals CRST[C−1:0], a row control signal REN[n−1] may be provided to an nth row of the current cell array 210. Also, the row control signal REN[n−1] may be provided to the nth row of the current cell array 210 while the current cells corresponding to the k columns are being successively controlled to have the transition state by the transition state setting signals CSET[0] to CSET[k−

1]. Current cells selected by the row control signal REN[n−1] may be controlled to have the initialized state or the transition state.

After a time interval for determining a signal level elapses, a reset level of an electric signal generated by the photo-sensitive element 151b with the 3T structure may be determined. Turning to FIG. 18, at time 't24', the initialization signal INIT may be provided again. An operation of initializing states of the current cells 211 may begin in response to the initialization signal INIT.

At time 't24', the second cell state setting signal CS2 with the intensity corresponding to logic '1' may be pulsed based on the initialization signal INIT. Further, at time 't24', the first cell state setting signal CS1 with the intensity corresponding to logic '0' may be pulsed.

Turning back to FIG. 17, at time 't24', the initialized state setting signals CRST[C−1:0] may be generated. The initialized state setting signals CRST[C−1:0] may be generated based on the second cell state setting signal CS2. As set forth above, in order to generate the reference signal ROUT being the 3T ramp signal, each of the current cells 211 may be controlled not to generate current at the initialized state. In order to initialize states of the current cells 211, the initialized state setting signals CRST[C−1:0] may be provided to the C columns of the current cell array 210. Thus, the reference signal ROUT may have the first intensity I21 at time 'T24'.

The transition state setting signals CSET[0] to CSET[C−1] may be generated, from time 't25' to time 't26'. In particular, an interval between time 't25' and time 't26' is a time interval where a reset level of an electric signal generated by the photo-sensitive element 151b with the 3T structure is determined. The transition state setting signals CSET[0] to CSET[C−1] may be generated based on the first cell state setting signal CS1. As set forth above, in order to generate the reference signal ROUT being the 3T ramp signal, each of the current cells 211 may be controlled to generate current at the transition state.

The transition state setting signals CSET[0] to CSET[C−1] may be provided to the C columns of the current cell array 210 in order to control the current cell array 210 such that each of the current cells has the transition state, from time 't25' to time 't26'. Unlike the time interval for determining the signal level, the transition state setting signals CSET[0] to CSET[C−1] may be provided to current cells in C columns during the time interval for determining the reset level. In particular, after the current cells 211 have the initialized state, each of the current cells may be successively controlled to have the transition state based on the transition state setting signals CSET[0] to CSET[C−1]. The intensity of current provided from the current cell array 210 to the analog signal output section 270 may vary (herein, may increase) according to the number of current cells controlled to have the transition state. That is, the intensity of the reference signal ROUT may vary according to the number of current cells controlled to have the transition state. Thus, the intensity of the reference signal ROUT may stepwise increase from 't25' to 't26' within an intensity interval that is defined by the first intensity I21 and third intensity I23, as shown in FIG. 18.

When states of the current cells 211 are initialized by the initialized state setting signals CRST[C−1:0], the row control signal REN[n−1] may be provided to the nth row of the current cell array 210. Further, the row control signal REN[n−1] may be provided to the nth row of the current cell array 210 while the current cells 211 are being successively controlled to have the transition state by the transition state setting signals CSET[0] to CSET[C−1]. The current cells selected by the row control signal REN[n−1] may be controlled to have the initialized state or the transition state.

The row control signal REN[n−1] may be successively provided to the current cell array 210, from a first row to an nth row, where n<R and R denotes the total number of rows. Thus, an operation described with reference to FIGS. 17 and 18 may be performed with respect to each of n rows of the current cell array 210.

As described with reference to FIGS. 15 to 18, a state of each of the current cells 211 may be initialized based on a first cell state setting signal CS1 or a second cell state setting signal CS2. With this exemplary embodiment, as illustrated in FIG. 13, a global reset transistor MG may be removed from each of the current cells 211. Thus, it is possible to reduce an area occupied by a chip including an analog signal generation circuit 200. Further, it is possible to reduce a power consumed by a chip.

However, timing diagrams illustrated in FIGS. 15 to 18 and descriptions on FIGS. 15 to 18 are provided to help in understanding the present inventive concept. The present exemplary embodiment may control a state of each of the current cells 211 with the first cell state setting signal CS1 and the second cell state setting signal CS2, without using a global reset signal GRST (refer to FIG. 9). The procedure for controlling states of current cells 211 based on the first cell state setting signal CS1 and the second cell state setting signal CS2 may be variously changed or modified. Timing diagrams illustrated in FIGS. 15 to 18 and descriptions of FIGS. 15 to 18 are provided by way of example and are not intended to limit the inventive concept.

Figure 19:
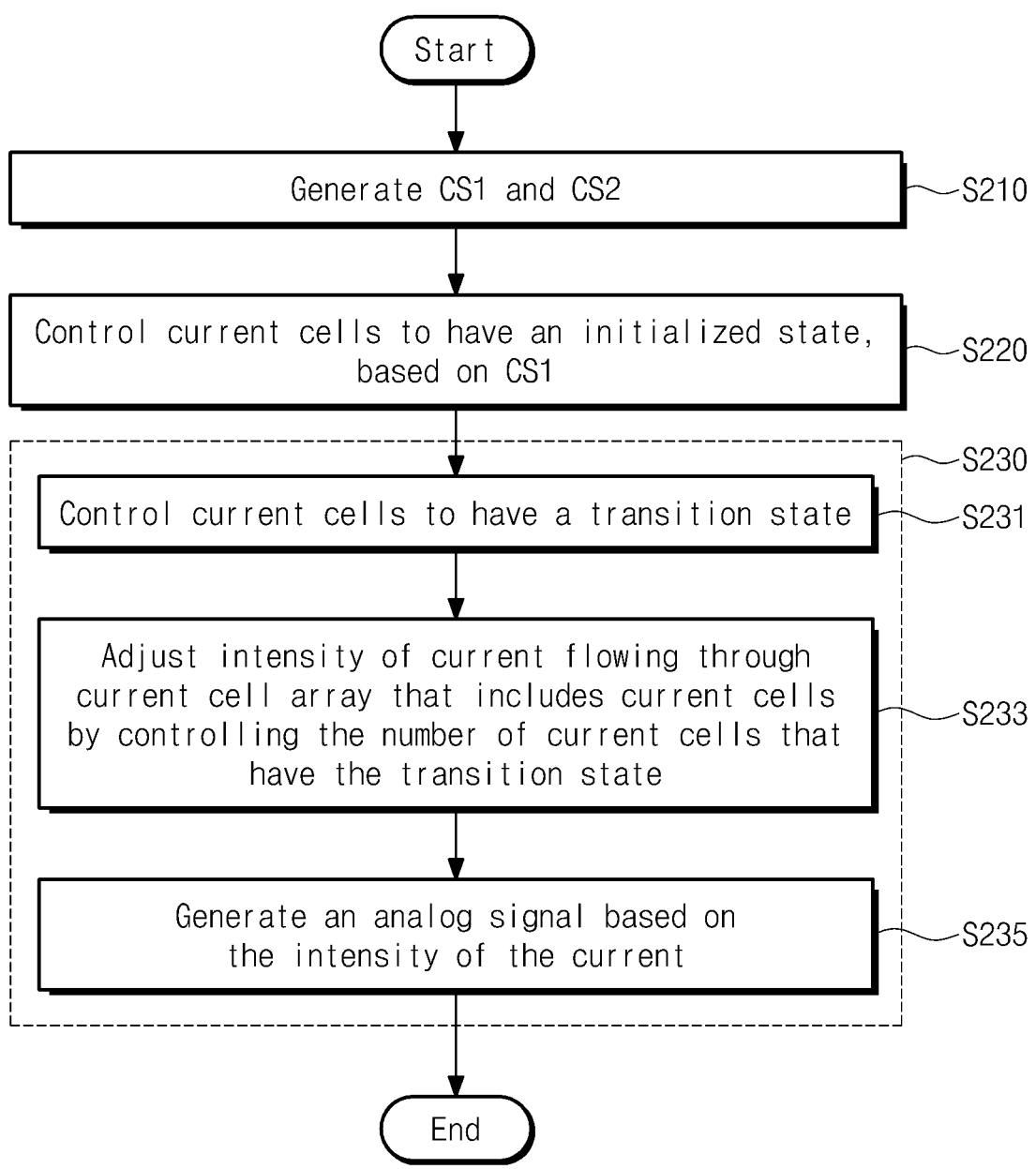
FIG. 19 is a flowchart describing a method of generating an analog signal according to another exemplary embodiment.

FIG. 19 is a flow chart describing a method of generating an analog signal according to another exemplary embodiment. Operations S210 and S220 are the same as those S110 and S120 described with reference to FIG. 14, and therefore descriptions that overlap corresponding descriptions of FIG. 14 are omitted.

In operation S230, an analog signal may be generated. Operation S230 may include operations S231, S233 and S235.

In operation S231, a current cell that is controlled by a control signal (e.g., a first control signal generated by a first control section 230 (refer to FIG. 6) and a second control signal generated by a second control section 250 (refer to FIG. 6)) may be selected from among a plurality of current cells 211 (refer to FIG. 6) included in a current cell array 210 (refer to FIG. 6). In operation S231, current cells 211 may be controlled to have a transition state.

In operation S233, the intensity of current that flows through the current cell array 210 may be adjusted. The intensity of current may vary according to the number of current cells which are controlled to have the transition state in operation S231. That is, by varying the number of current cells which are controlled to have the transition state, the intensity of the current flowing through the current cell array 210 may be controlled and adjusted.

In operation S235, an analog signal may be generated. The analog signal may be generated based on the intensity of current which is adjusted in operation S233. The procedure for generating the analog signal is the same as that described with reference to FIGS. 15 to 18.

Figure 20:
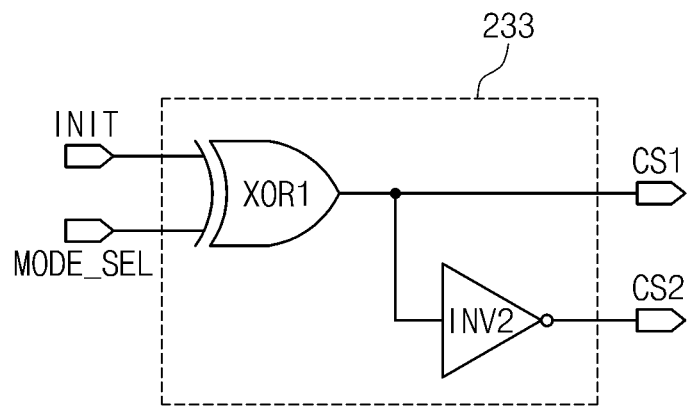
FIG. 20 is a diagram illustrating a first control section of an analog signal generation circuit according to an exemplary embodiment.

FIG. 20 is a diagram illustrating a first control section of an analog signal generation circuit according to an exemplary embodiment. A first control section 230 may include a cell state setting signal generation section 233.

The cell state setting signal generation section 233 may receive an initialization signal INIT. The cell state setting signal generation section 233 may further receive a mode selection signal MODE_SEL. As described with reference to FIG. 11, the mode selection signal MODE_SEL is a signal for changing an operation mode of the analog signal generation circuit 200. As described with reference to FIGS. 15 to 18, the initialization signal INIT is a trigger signal for controlling a current cell array 210 (refer to FIG. 6) to initialize a state of each of current cells 211 (refer to FIG. 6).

The cell state setting signal generation section 233 may generate a first cell state setting signal CS1 and a second cell state setting signal CS2 by using the initialization signal INIT. In some exemplary embodiments, the cell state setting signal generation section 233 may generate the first cell state setting signal CS1 and the second cell state setting signal CS2 by using the initialization signal INIT and the mode selection signal MODE_SEL. The initialization signal INIT is used to initialize a state of each of the current cells 211. On the other hand, the mode selection signal MODE_SEL may be used to change waveforms of the first cell state setting signal CS1 and the second cell state setting signal CS2 according to an operation mode of the analog signal generation circuit 200.

As set forth above, a logical value corresponding to the first cell state setting signal CS1 may be complementary to a logical value corresponding to the second cell state setting signal CS2. In some exemplary embodiments, the cell state setting signal generation section 233 may include an inverter INV2.

In some exemplary embodiments, the cell state setting signal generation section 233 may further include an exclusive OR gate XOR1. To help in understanding, it is assumed that the first cell state setting signal CS1 and the second cell state setting signal CS2 for controlling generation of a 4T ramp signal are generated when the mode selection signal MODE_SEL has a logical value corresponding to logic '0'. Also, it is further assumed that the first cell state setting signal CS1 and the second cell state setting signal CS2 for controlling generation of a 3T ramp signal are generated when the mode selection signal MODE_SEL has a logical value corresponding to logic '1'. However, these assumptions are only an example, and other logic states may be chosen.

Under the above assumption, when the mode selection signal MODE_SEL has a logical value corresponding to logic '0' and the initialization signal INIT is generated (e.g., the initialization signal INIT has a logical value corresponding to logic '1' in this exemplary embodiment), the first cell state setting signal CS1 may have a logical value corresponding to logic '1' and the second cell state setting signal CS2 may have a logical value corresponding to logic '0'. Accordingly, signal control corresponding to time 't11' and time 't14' illustrated in FIG. 15 may be performed. On the other hand, when the mode selection signal MODE_SEL has a logical value corresponding to logic '1' and the initialization signal NIT is generated (e.g., the initialization signal INIT has a logical value corresponding to logic '1' in this exemplary embodiment), the first cell state setting signal CS1 may have a logical value corresponding to logic '0' and the second cell state setting signal CS2 may have a logical value corresponding to logic '1'. Accordingly, signal control corresponding to time 't21' and time 't24' illustrated in FIG. 17 may be performed.

However, a configuration of the cell state setting signal generation section 233 may be changed or modified. For instance, the first cell state setting signal CS1 and the second cell state setting signal CS2 for controlling generation of a 3T ramp signal may be generated when the mode selection signal MODE_SEL has a logical value corresponding to logic '0', and the first cell state setting signal CS1 and the second cell state setting signal CS2 for controlling generation of a 4T ramp signal may be generated when the mode selection signal MODE_SEL has a logical value corresponding to logic '1'. That is, a generated signal may be configured to vary based on the mode selection signal MODE_SEL.

Moreover, as well as the initialization signal INIT and the mode selection signal MODE_SEL, other signals may be further used to generate the first cell state setting signal CS1 and the second cell state setting signal CS2. That is, a configuration of the cell state setting signal generation section 233 illustrated in FIG. 20 is an example and is not intended to limit the present inventive concept. One of ordinary skill in the art will understand that a cell state setting signal generation section 233 with a changed configuration is included in the inventive concept.

Figure 21:
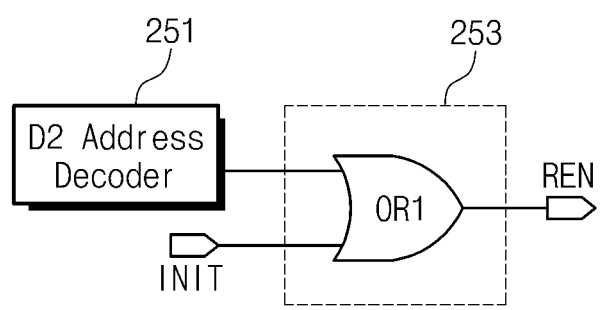
FIG. 21 is a diagram illustrating a second control section of an analog signal generation circuit according to an exemplary embodiment.

FIG. 21 is a diagram illustrating a second control section of an analog signal generation circuit according to an exemplary embodiment. A second control section 250 may include a second direction address decoder 251 and a control signal generation section 253.

The second direction address decoder 251 may output an address signal. The address signal is a signal for selecting a current cell to be controlled from among current cells 211 (refer to FIG. 6) included in a current cell array 210 (refer to FIG. 6). That is, current cells that are selected by the address signal output from the second direction address decoder 251 may be controlled to have an initialized state or a transition state.

The control signal generation section 253 may receive the address signal output from the second direction address decoder 251 and an initialization signal INIT. The control signal generation section 253 may generate a row control signal REN by using the address signal and the initialization signal INIT. In some exemplary embodiments, the control signal generation section 253 may include an OR gate OR1. In this case, the row control signal REN may be generated when the address signal for selecting a current cell is provided (e.g., the address signal has a logical value corresponding to logic '1' in this exemplary embodiment) or the initialization signal NIT is generated. Accordingly, signal control on time 't11', 't12', 't14' and 't15' illustrated in FIGS. 15 and 16 may be performed. Also, signal control on time 't21', 't22', 't24' and 't25' illustrated in FIGS. 17 and 18 may be performed.

A configuration of the control signal generation section 253 may be changed or modified. Moreover, as well as the address signal and the initialization signal INIT, other signals may be further used to generate the row control signal REN. That is, the control signal generation section 253 illustrated in FIG. 21 is an example and is not intended to limit the present inventive concept. One of ordinary skill in the art will understand that a control signal generation section 253 with a changed configuration is included in the inventive concept.

Figure 22:
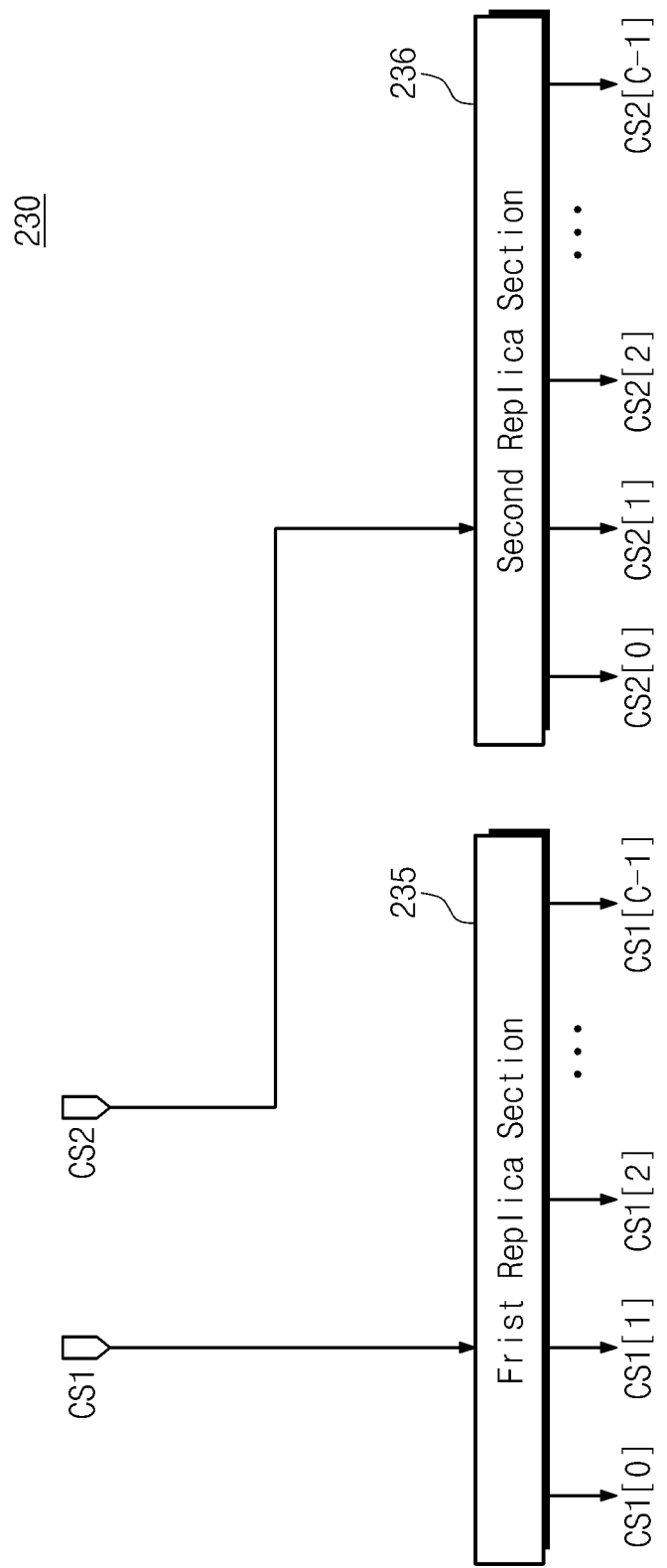
FIG. 22 is a diagram illustrating a first control section of an analog signal generation circuit according to an exemplary embodiment.

FIG. 22 is a diagram illustrating a first control section of an analog signal generation circuit according to an exemplary embodiment. A first control section 230 may include a first replica section 235 and a second replica section 236.

The first replica section 235 may receive a first cell state setting signal CS1. The first replica section 235 may replicate the received first cell state setting signal CS1. The first cell state setting signal CS1 may be replicated as many as a predetermined number. For instance, the first cell state setting signal CS1 may be replicated as many as the number of current cells arranged along a second direction D2 (refer to FIG. 6), e.g., C. The first replica section 235 may provide the replicated first cell state setting signals CS1[0] to CS1[C−1] to a current cell array 210 (refer to FIG. 6). The first cell state setting signals CS1[0] to CS1[C−1] may be provided to the current cell array 210 along a first direction D1 (refer to FIG. 6).

The second replica section 236 may receive a second cell state setting signal CS2. The second replica section 236 may replicate the received second cell state setting signal CS2. The second cell state setting signal CS2 may be replicated as many as a predetermined number. For instance, the second cell state setting signal CS2 may be replicated as many as the number of current cells arranged along the second direction D2, e.g., C. The second replica section 236 may provide the replicated second cell state setting signals CS2[0] to CS2[C−1] to the current cell array 210. The second cell state setting signals CS2[0] to CS2[C−1] may be provided to the current cell array 210 along the first direction D1.

In view of the timing diagrams illustrated in FIGS. 15 and 16, initialized state setting signals CSET[C−1:0] may be generated based on the replicated first cell state setting signals CS1[0] to CS1[C−1], and transition state setting signals CRST[0] to CRST[C−1] may be generated based on the replicated second cell state setting signals CS2[0] to CS2[C−1]. Similarly, in view of the timing diagrams illustrated in FIGS. 17 and 18, initialized state setting signals CRST[C−1:0] may be generated based on the replicated second cell state setting signals CS2[0] to CS2[C−1], and transition state setting signals CSET[0] to CSET[C−1] may be generated based on the replicated first cell state setting signals CS1[0] to CS1[C−1].

That is, each of current cells 211 (refer to FIG. 6) included in the current cell array 210 may be controlled based on the replicated first cell state setting signals CS1[0] to CS1[C−1] and the replicated second cell state setting signals CS2[0] to CS2[C−1]. Thus, an analog signal (e.g., 4T ramp signal or 3T ramp signal) may be generated.

Figure 23:
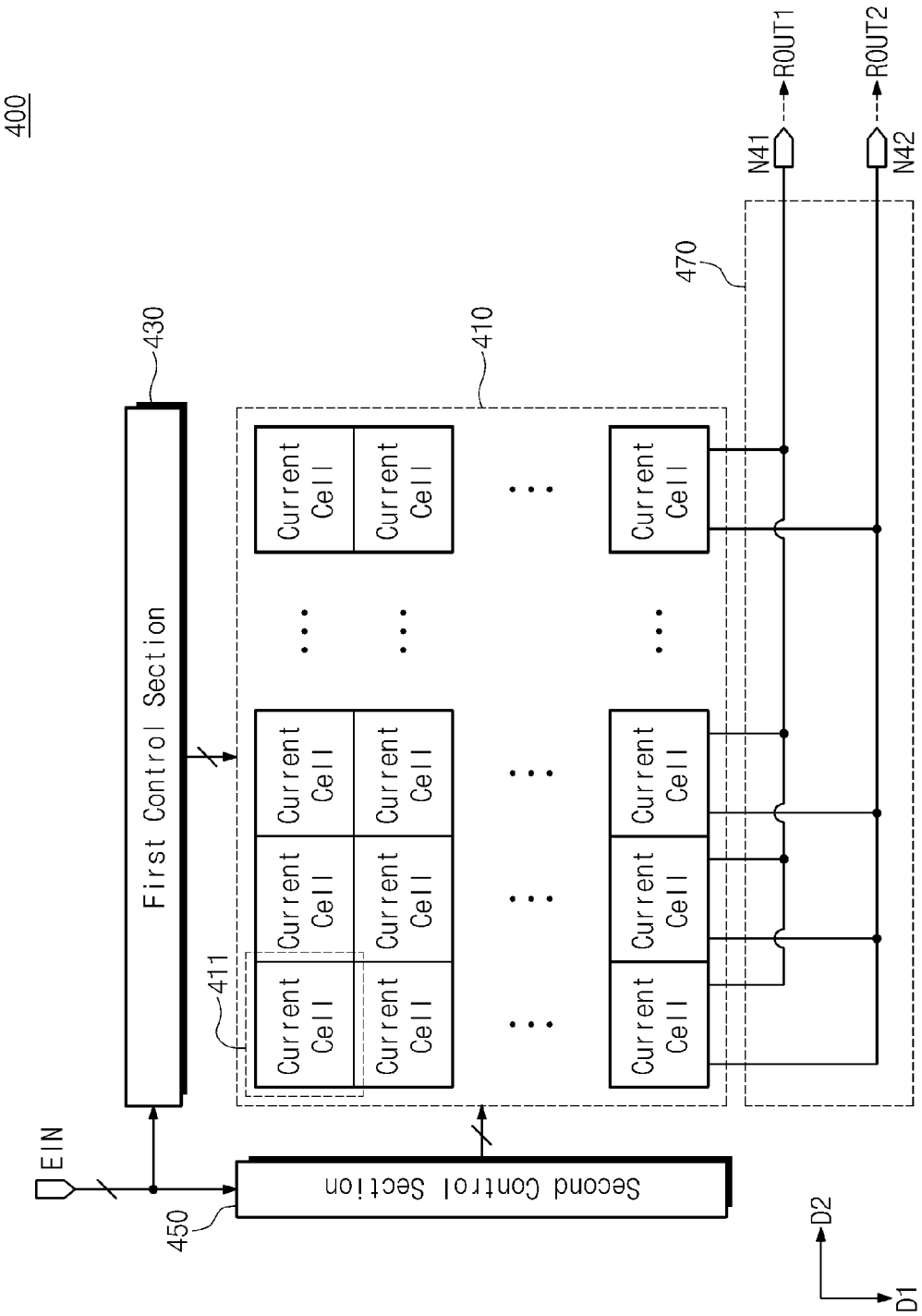
FIG. 23 is a block diagram illustrating an analog signal generation circuit according to an exemplary embodiment.

FIG. 23 is a block diagram illustrating an analog signal generation circuit according to an exemplary embodiment. An analog signal generation circuit 400 may include a current cell array 410, a first control section 430, a second control section 450, and an analog signal output section 470. Configurations and functions of the current cell array 410, the first control section 430, and the second control section 450 may include those of a current cell array 210, a first control section 230, and a second control section 250 illustrated in FIG. 6. In some exemplary embodiments, the analog signal generation circuit 400 may be used as a ramp signal generator 330 illustrated in FIG. 7. Detailed descriptions on the analog signal generation circuit 400 that overlap with descriptions of FIG. 6 are omitted.

The analog signal output section 470 may output an analog signal. The analog signal may be generated based on current provided from the plurality of current cells 411 included in the current cell array 410. In this exemplary embodiment, the analog signal may be output through a first output terminal N41 and a second output terminal N42. The analog signal may be output from the first output terminal N41 as a first reference signal ROUT1, and output from the second output terminal N42 as a second reference signal ROUT2. Each of the first reference signal ROUT1 and the second reference signal ROUT2 may be one of a 4T ramp signal described with reference to FIG. 4 and a 3T ramp signal described with reference to FIG. 5.

Unlike the analog signal output section 270 illustrated in FIG. 6, the analog signal output section 470 illustrated in FIG. 23 may include only two output paths. In this exemplary embodiment, the analog signal output section 470 may omit a switch section 272 (refer to FIG. 6). In this exemplary embodiment, waveforms of the first reference signal ROUT1 and the second reference signal ROUT2 respectively output from the first output terminal N41 and the second output terminal N42 may be uniquely determined.

Figure 24:
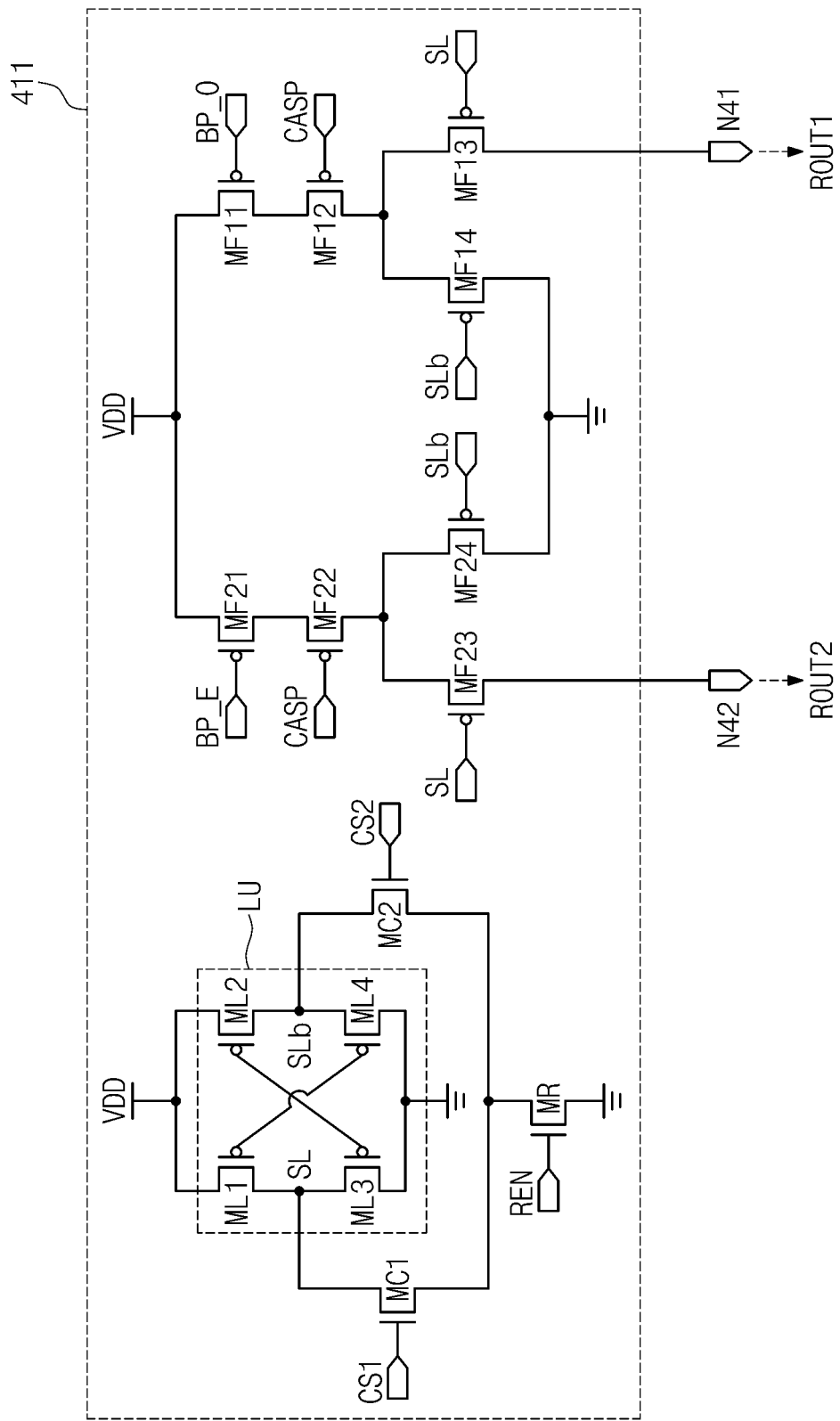
FIG. 24 is a conceptual diagram illustrating a current cell of an analog signal generation circuit according to an embodiment of the present invention.

FIG. 24 is a diagram illustrating a current cell of an analog signal generation circuit according to an exemplary embodiment. In some exemplary embodiments, each current cell 411 shown in FIG. 23 may have a configuration illustrated in FIG. 24. A configuration of the current cell 411 illustrated in FIG. 24 is obtained by removing a global reset transistor MG (refer to FIG. 8) from a configuration of a current cell 211a illustrated in FIG. 8. Descriptions on FIG. 24 that overlap with descriptions of FIG. 8 are omitted.

A state of the current cell 411 may be controlled based on a first cell state setting signal CS1 and a second cell state setting signal CS2. The current cell 411 may be controlled to have an initialized state or a transition state based on the first cell state setting signal CS1 and the second cell state setting signal CS2. The procedure for controlling the current cell 411 based on the first cell state setting signal CS1 and the second cell state setting signal CS2 is the same as that described with reference to FIGS. 13 to 18.

In the exemplary embodiment of FIG. 24, an area occupied by the analog signal generation circuit 400 including the current cell 411 and a chip including the analog signal generation circuit 400 may be reduced by removing the global reset transistor MG from the current cell 411. Further, it is possible to reduce a power consumed by the chip.

Figure 25:
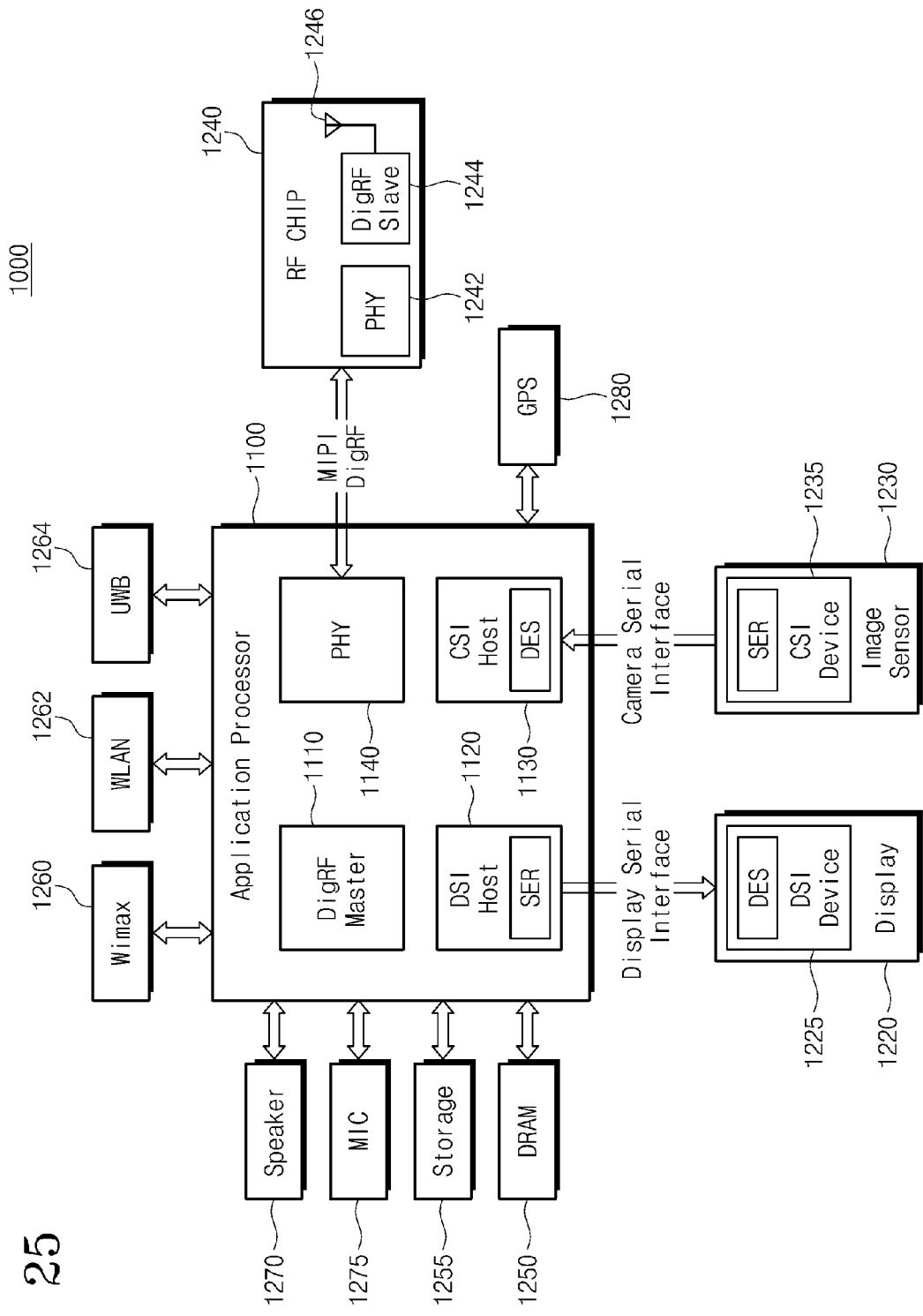
FIG. 25 is a block diagram illustrating an electronic system including an analog signal generation circuit according to an exemplary embodiment, and an interface thereof.

FIG. 25 is a block diagram illustrating an electronic system including an analog signal generation circuit according to an exemplary embodiment, and an interface thereof. Referring to FIG. 25, an electronic system 1000 may be implemented as a data processing device, for instance, a cellular phone, a personal digital assistant (PDA), a portable multimedia player (PMP), or a smart phone, which is capable of using or supporting a Mobile Industry Processor Interface (MIPI).

The electronic system 1000 may include an application processor 1100, a display 1220, and an image sensor 1230. The application processor 1100 may include a DigRF master 1110, a display serial interface (DSI) host 1120, a camera serial interface (CSI) host 1130, and a physical layer (PHY) 1140.

The DSI host 1120 may communicate with a DSI device 1225 of the display 1220 through a display serial interface. For instance, an optical serializer SER may be implemented in the DSI host 1120, and an optical de-serializer DES may be implemented in the DSI device 1225.

The CSI host 1130 may communicate with a CSI device 1235 of the image sensor 1230 through a camera serial interface. An optical serializer SER may be implemented in the CSI device 1235, and an optical de-serializer DES may be implemented in the CSI host 1130.

In some exemplary embodiments, the image sensor 1230 may be an image sensor 300 illustrated in FIG. 7. In this case, configurations and functions according to the present inventive concept may be included in those of the image sensor 1230. In particular, an analog signal generation circuit 200 illustrated in FIG. 6 or an analog signal generation circuit 400 illustrated in FIG. 23 may be included in the image sensor 1230 as a ramp signal generator 330 (refer to FIG. 7). In some exemplary embodiments, a state of each current cell included in an analog signal generation circuit may be controlled by two cell state setting signals, without a global reset signal. In other exemplary embodiments, a waveform of an analog signal generated by an analog signal generation circuit may vary based on a mode selection signal. The above exemplary embodiments have been described with reference to FIGS. 6 to 24.

The electronic device 1000 may further comprise a radio frequency (RF) chip 1240 capable of communicating with the application processor 1100. The RF chip 1240 may include a physical layer (PHY) 1242, a DigRF slave 1244, and an antenna 1246. For instance, data may be exchanged between the PHY 1242 of the RF chip 1240 and the PHY 1140 of the application processor 1100 according to a MIPI DigRF interface.

The electronic system 1000 may further comprise a dynamic random access memory (DRAM) 1250 and a storage 1255. The DRAM 1250 and the storage 1255 may store data provided from the application processor 1100. Also, the DRAM 1250 and the storage 1255 may provide data stored therein to the application processor 1100.

For instance, the electronic system 1000 may communicate with an external system by using at least one of world interoperability for microwave access (Wimax) 1260, wireless local area network (WLAN) 1262, ultra wideband (UWB) 1264, and so on. Also, the electronic system 1000 may further comprise a speaker 1270 and a microphone 1275 for processing voice information. The electronic system 1000 may further comprise a global positioning system (GPS) device 1280 for processing position information.

A configuration illustrated in each diagram should be understood just from a conceptual point of view. Shape, structure, and size of each component illustrated in each conceptual diagram may be exaggerated or downsized for better understanding of the present inventive concept. An actually implemented configuration may have a physical shape different from a configuration of each conceptual diagram. The present inventive concept is not limited to a physical shape or size illustrated in each conceptual diagram.

A device configuration illustrated in each block diagram is to help in understanding the present inventive concept. Each block may be formed of smaller blocks according to a function. Alternatively, a plurality of blocks may form a larger block according to a function. That is, the present inventive concept is not limited to components illustrated in each block diagram.

While exemplary embodiments have been described, it will be apparent to those skilled in the art that various changes and modifications may be made without departing from the spirit and scope of the present inventive concept. Therefore, it should be understood that the above exemplary embodiments are not limiting, but illustrative.

What is claimed is:

1. An analog signal generation circuit comprising:
    a first control section configured to generate a first control signal;
    a second control section configured to generate a second control signal;
    a plurality of current cells, each of the plurality of current cells configured to be controlled to generate current or not to generate current based on the first control signal and the second control signal; and
    an analog signal output section configured to output an analog signal generated based on current generated by the plurality of current cells,
    wherein the first control signal comprises a first cell state setting signal and a second cell state setting signal;
    wherein the first control section comprises a cell state setting signal generation section configured to generate the first cell state setting signal and the second cell state setting signal in response to an initialization signal;
    wherein a logical value corresponding to the first cell state setting signal is complementary to a logical value corresponding to the second cell state setting signal; and
    wherein a current cell selected to be controlled by the first control signal and the second control signal from among the plurality of current cells is configured to have an initialized state based on the first cell state setting signal.

2. The analog signal generation circuit of claim 1, wherein the current cell selected to be controlled by the first control signal and the second control signal is configured to have a transition state that is different from the initialized state based on the second cell state setting signal.

3. The analog signal generation circuit of claim 2, wherein when the current cell selected to be controlled by the first control signal and the second control signal generates current at the initialized state, the current cell selected to be controlled by the first control signal and the second control signal does not generate current at the transition state.

4. The analog signal generation circuit of claim 2, wherein when the current cell selected to be controlled by the first control signal and the second control signal does not generate current at the initialized state, the current cell selected to be controlled by the first control signal and the second control signal generates current at the transition state.

5. The analog signal generation circuit of claim 2, wherein all of the plurality of current cells are controlled to be in the initialized state and after all the plurality of current cells are in the initialized state, each of the plurality of current cells is successively controlled to have the transition state based on the second cell state setting signal.

6. The analog signal generation circuit of claim 5, wherein an intensity of current provided to the analog signal output section varies according to a number of current cells controlled to have the transition state from among the plurality of current cells.

7. The analog signal generation circuit of claim 1, wherein the plurality of current cells is arranged along a first direction and a second direction,
    wherein the first control section comprises:
    a first replica section configured to:
        replicate the first cell state setting signal as many as a number of current cells arranged along the second direction, and
        provide the replicated first cell state setting signals to the plurality of current cells along the first direction; and
    a second replica section configured to:
        replicate the second cell state setting signal as many as a number of current cells arranged along the second direction, and
        provide the replicated second cell state setting signals to the plurality of current cells along the first direction.

8. An analog signal generation circuit comprising:
    a first control section configured to generate a first control signal;
    a second control section configured to generate a second control signal;
    a plurality of current cells, each of the plurality of current cells configured to be controlled to generate current or to not generate current based on the first control signal and the second control signal; and an analog signal output section configured to output a first reference signal and a second reference signal that are generated based on current generated by the plurality of current cells, wherein the first control signal comprises a first cell state setting signal and a second cell state setting signal;

wherein the first control section comprises a cell state setting signal generation section configured to generate the first cell state setting signal and the second cell state setting signal in response to an initialization signal;

wherein a logical value corresponding to the first cell state setting signal is complementary to a logical value corresponding to the second cell state setting signal;

wherein a current cell selected to be controlled by the first control signal and the second control signal from among the plurality of current cells is configured to have an initialized state based on the first cell state setting signal; and wherein the analog signal output section comprises:
a first output route configured to provide the first reference signal to a first output terminal;
a second output route and a third output route configured to provide the second reference signal to a second output terminal; and
a switch section configured to control connections between the second output terminal and the second output route and between the second output terminal and the third output route, based on a mode selection signal such that the second reference signal is provided to the second output terminal through one of the second output route and the third output route.

9. The analog signal generation circuit of claim 8, wherein the cell state setting signal generation section is configured to generate the first cell state setting signal and the second cell state setting signal based on the initialization signal and the mode selection signal.

10. The analog signal generation circuit of claim 9, wherein the second control section comprises a control signal generation section configured to generate the second control signal based on an address signal and the initialization signal.

11. The analog signal generation circuit of claim 8, wherein the current cell selected to be controlled by the first control signal and the second control signal is configured to have a transition state that is different from the initialized state based on the second cell state setting signal.

12. The analog signal generation circuit of claim 8, wherein waveforms of the first cell state setting signal and the second cell state setting signal are changed according to the mode selection signal.

13. The analog signal generation circuit of claim 8, wherein each of the first reference signal and the second reference signal is one of a 4T ramp signal and a 3T ramp signal.

14. The analog signal generation circuit of claim 13, wherein the second reference signal is the 4T ramp signal when the mode selection signal has a logical value corresponding to logic '0', and wherein the second reference signal is the 3T ramp signal when the mode selection signal has a logical value corresponding to logic '1'.

15. The analog signal generation circuit of claim 13, wherein the second reference signal is the 3T ramp signal when the mode selection signal has a logical value corresponding to logic '0', and wherein the second reference signal is the 4T ramp signal when the mode selection signal has a logical value corresponding to logic '1'.

16. An analog signal generation circuit comprising:
a first control section configured to generate a first control signal;
a second control section configured to generate a second control signal;
a plurality of current cells, each of the plurality of current cells configured to be controlled to generate current or to not generate current based on the first control signal and the second control signal; and
an analog signal output section configured to output a first reference signal and a second reference signal generated based on current generated by the plurality of current cells,
wherein the analog signal output section comprises:
a first output route configured to provide the first reference signal to a first output terminal;
a second output route and a third output route configured to provide the second reference signal to a second output terminal; and
a switch section configured to control connections between the second output terminal and the second output route and between the second output terminal and the third output route based on a mode selection signal such that the second reference signal is provided to the second output terminal through one of the second output route and the third output route.

17. The analog signal generation circuit of claim 16, wherein the analog signal output section further comprises a switch signal generation section configured to generate a first switch signal and a second switch signal based on the mode selection signal, and wherein the first switch signal controls a connection between the second output route and the second output terminal, and the second switch signal controls a connection between the third output route and the second output terminal.

18. The analog signal generation circuit of claim 17, wherein a logical value corresponding to the first switch signal is complementary to a logical value corresponding to the second switch signal.

19. The analog signal generation circuit of claim 16, wherein a waveform of the second reference signal output from the second output terminal is selected based on the mode selection signal.

20. The analog signal generation circuit of claim 16, wherein a waveform of the first reference signal output from the first output terminal is different from a waveform of the second reference signal output from the second output terminal.

* * * * *